United States Patent
Itasaka et al.

(10) Patent No.: US 6,392,433 B2
(45) Date of Patent: *May 21, 2002

(54) METHOD AND APPARATUS FOR TESTING SEMICONDUCTOR DEVICES

(75) Inventors: Kenji Itasaka; Terumi Kamifukumoto; Yuji Akasaki; Nobuo Ooyama, all of Kagoshima (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/350,925

(22) Filed: Jul. 12, 1999

(30) Foreign Application Priority Data

Dec. 1, 1998 (JP) .......................................... 10-341936

(51) Int. Cl.[7] .............................................. G01R 31/26
(52) U.S. Cl. .................................... 324/765; 324/158.1
(58) Field of Search ............................... 324/765, 761, 324/763, 158.1; 438/460, 462, 464; 357/666, 668, 680

(56) References Cited

U.S. PATENT DOCUMENTS

| | | | | |
|---|---|---|---|---|
| 4,046,985 A | * | 9/1977 | Gates ..................... | 219/121.82 |
| 5,899,729 A | * | 5/1999 | Lee ........................... | 438/460 |
| 5,999,268 A | * | 12/1999 | Yonezawa et al. ........... | 324/754 |
| 6,174,789 B1 | * | 1/2001 | Tsukada ..................... | 438/462 |

* cited by examiner

Primary Examiner—N. Le
Assistant Examiner—James Kerveros
(74) Attorney, Agent, or Firm—Armstrong, Westerman & Hattori, LLP

(57) ABSTRACT

A method of testing semiconductor devices includes an adhering step, a position correcting step, and an electrical test step. The adhering step includes adhering either a semiconductor device collective body or a plurality of individual semiconductor devices onto an adhesive tape provided on a tape-holding member, the semiconductor device collective body being constructed by a plurality of semiconductor devices integrated together. The position correcting step includes positioning the semiconductor devices by mounting the tape-holding member on a position correction unit and, using an image processing technique, implementing position recognition and position correction of the semiconductor devices adhered on the adhesive tape. The electrical test step includes implementing an electrical characteristic test on the semiconductor devices positioned in the position correction step by connected the semiconductor devices on a testing contactor.

8 Claims, 19 Drawing Sheets

(ETCHING)

METHOD AND APPARATUS FOR TESTING SEMICONDUCTOR DEVICES

BACKGROUND OF THE INVENTION

1. Field of the Invention

The present invention generally relates to a method and an apparatus for testing semiconductor devices, and particularly relates to a method and an apparatus for testing small-sized semiconductor devices such as a leadless surface mount type.

Recently, along with miniaturized electronic components, semiconductor devices of a leadless surface mount type, referred to as CSP (Chip Size Package), have become one of the major types of semiconductor devices. Also, a further improvement of the reliability and a further cost reduction are required for the semiconductor devices.

In order to improve the reliability, it is necessary to implement an accurate test on the semiconductor devices. Also, in order to reduce the cost of the semiconductor devices, such a test should be implemented with a higher efficiency and with reduced cost.

2. Description of the Related Art

The semiconductor devices of the CSP type of the related art are tested as follows. Individualized semiconductor devices are uniformly aligned on a tray (accommodation container). Then, one or more of the semiconductor devices undergoes an electrical characteristic test by means of a horizontal-carrying-type test unit (handler). After the electrical characteristic test, the semiconductor devices are returned to the tray in such manner that they are categorized into good devices and bad devices.

Also, tested semiconductor devices are shipped to customers with while remaining accommodated in the tray, or being accommodated on an embossed tape provided with pockets and a cover, and wound on a reel.

When the semiconductor device (IC chip) is tested in the state of a wafer, first, the wafer is set on equipment having an XYθ driving system which equipment is referred to as an autoprober. Then, a probe, consisting of needle-like contacts, is brought into contact with electrodes (aluminum pads) on the IC chip. Thus, an electrical characteristic test is implemented. Such a testing method making use of the autoprober is implemented before dicing the wafer. The prerequisite for a such testing method is that each IC chip is positioned and aligned with a high accuracy of an angstrom order.

However, there are some drawbacks when testing the semiconductor devices using the handler of the related art. The semiconductor devices must be peeled off from an adhesive tape used for dicing and then aligned by means of an aligning unit. Alternatively, the semiconductor devices aligned on the adhesive tape can be pushed up by a picker, peeled off from the tape, and then transferred to a tray.

In the testing method using the handler, the semiconductor devices are individualized prior to the electrical characteristic test. Also, recently, the semiconductor devices have a high-density structure such that a pitch between terminals is under 0.5 mm. Therefore, since the positioning of the semiconductor devices is difficult, there is a drawback that it is difficult to achieve an accurate contact between the electrodes of the semiconductor device and contact pins of an electrical characteristic test unit. Further, there is a drawback that, since a variety of components are required when there is a change in the outer shape of the semiconductor devices, the handler lacks a general purpose use.

In the testing method using the autoprober, the electrical characteristic test is implemented by means of a needle-like prober having a long line length and thus high impedance. Therefore, there is a drawback that an electrical characteristic test of a high-frequency IC is not possible.

Also, there is a further drawback in a case of a high-density semiconductor device with a terminal pitch of less than 0.5 mm, or a semiconductor device provided with terminals provided as an array in an area. With such semiconductor devices, a needle-like prober having a short line length is not sufficient for achieving a secure contact with the terminals provided on the semiconductor devices. Therefore, it is not possible to implement the test with the prober having a short line length.

Further, in the case of the test using the autoprober, the test is implemented before dicing. Therefore, there is a drawback that it is not possible to take into account a stress produced in the IC chip by dicing.

SUMMARY OF THE INVENTION

Accordingly, it is a general object of the present invention to provide a semiconductor device of a high-density structure which can overcome the above-described drawbacks.

It is another and more specific object of the present invention to provide a method and an apparatus for testing the high-density semiconductor device with a higher accuracy, higher efficiency and reduced cost.

In order to achieve the above objects according to the present invention, a method of testing semiconductor devices includes an adhering step, a position correcting step, and an electrical test step. The adhering step includes adhering either a semiconductor device collective body or a plurality of individual semiconductor devices onto an adhesive tape provided on a tape-holding member, the semiconductor device collective body being constructed by a plurality of semiconductor devices integrated together. The position correcting step includes positioning semiconductor devices by mounting the tape-holding member on a position correction unit and, using an image processing technique, implementing position recognition and position correction of the semiconductor devices adhered on the adhesive tape. The electrical test step includes implementing an electrical characteristic test on the semiconductor devices positioned in the position correction step by connecting the semiconductor devices to a testing contactor.

With the method described above, it is possible to implement position recognition and position correction on each one of the semiconductor devices, even if the semiconductor devices have different positions on the adhesive tape.

Also, by using the image processing technique, a comparatively accurate position recognition and position correction is achieved. Further, even if there is a change in the size of the semiconductor devices, the test can be implemented without changing the structure of the testing apparatus.

Also, the electrical test process is implemented on the accurately positioned semiconductor devices. Thus, high-density semiconductor devices can be accurately and positively connected to the testing contactor. Thus, it is possible to improve the reliability of the electrical characteristic test.

In order to achieve the above objects, there is also provided an apparatus for testing a plurality of individualized semiconductor devices adhered on an adhesive tape provided on a tape-holding member. The apparatus includes:

a position correction unit for implementing position recognition and position correction on each one of the plurality of semiconductor devices using an image processing technique; and an electrical characteristic testing unit for implementing an electrical characteristic test on the semiconductor devices, the electrical characteristic testing unit being provided with a testing contactor to be connected to electrodes formed on the semiconductor devices and the semiconductor devices having been positioned corrected in the position correction unit being connected.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings.

Figure 1:
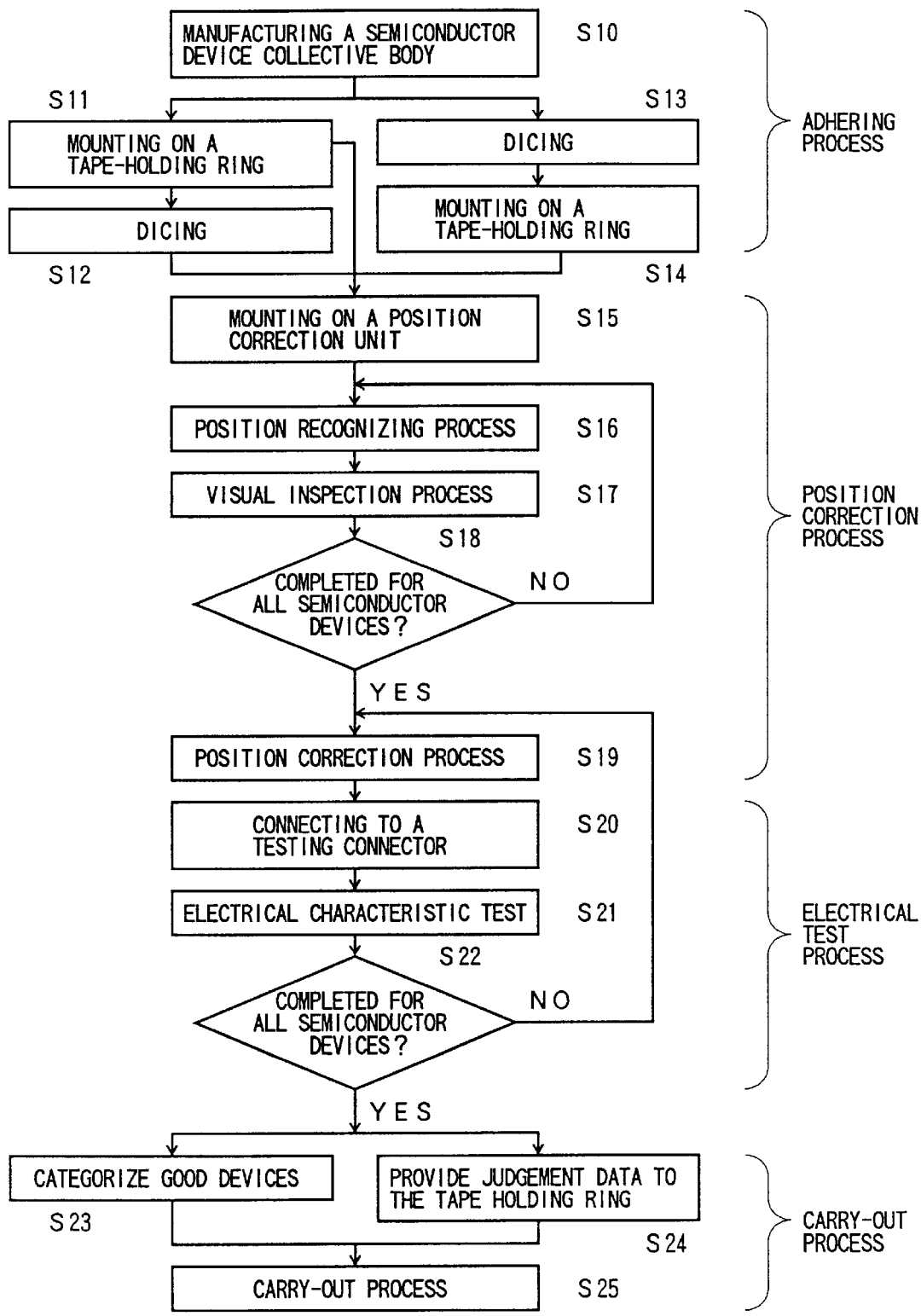
FIG. 1 is a flowchart showing a method of testing semiconductor devices of one embodiment according to the present invention.

FIG. 1 is a flowchart showing one embodiment of a method of testing semiconductor devices according to the present invention. As shown in FIG. 1, generally, the semiconductor device testing may be divided into an adhering process, steps 10 to 14, a position correction process, steps 15 to 19, an electrical test process, steps 19 to 22, and a carry-out process, steps 23 to 25. In the Figure, steps are abbreviated as "S".

Figure 2:
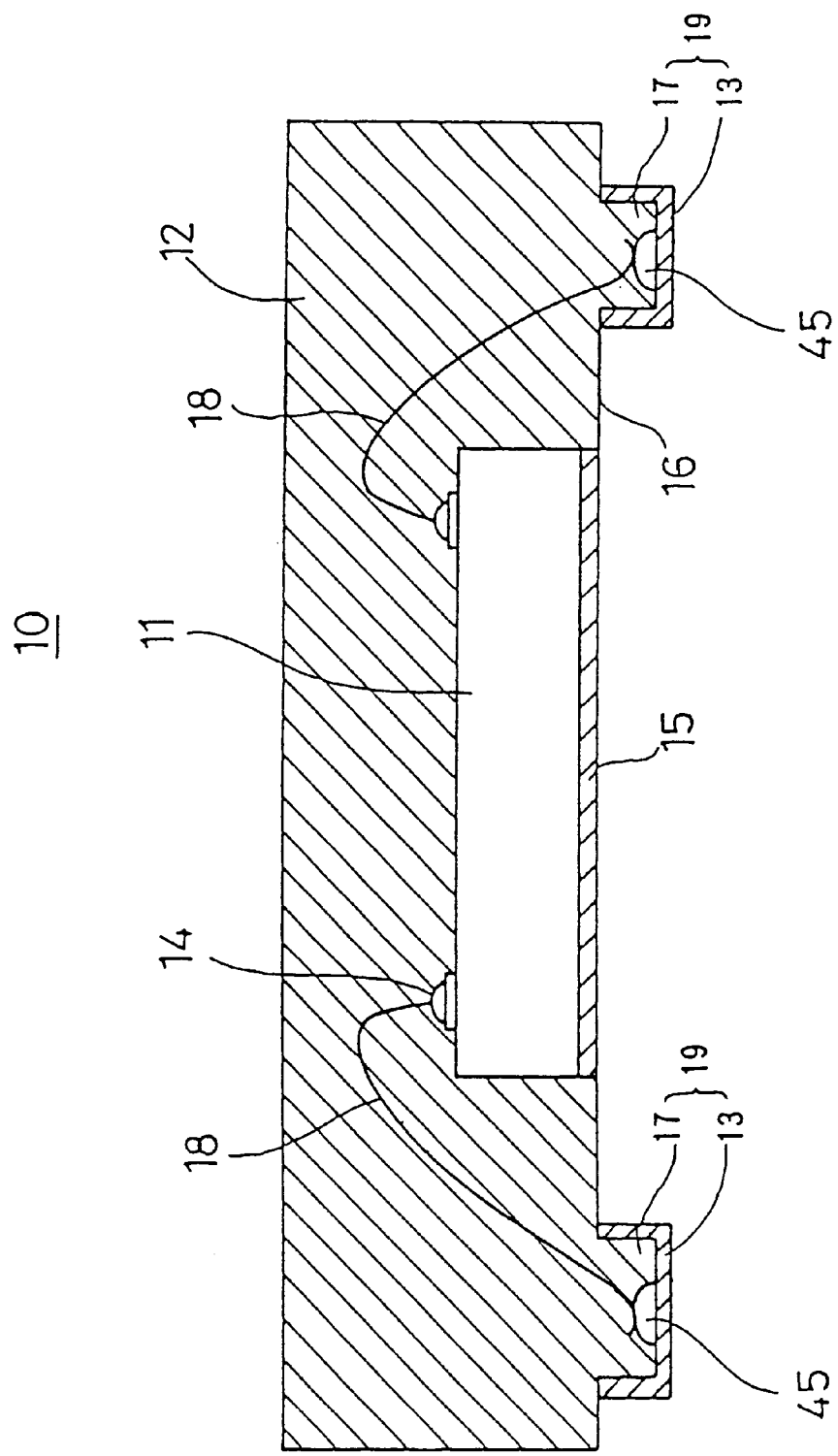
FIG. 2 is a cross-sectional diagram showing an example of a semiconductor device to be tested by the method of testing semiconductor devices according to the present invention.

Before describing the processes included in the semiconductor device testing method, a structure of a semiconductor device 10 to be tested will be described in brief. FIG. 2 is a cross-sectional diagram showing an example of a semiconductor device to be tested by the semiconductor device testing method according to the present invention. Generally, the semiconductor device 10 has a simple structure including a semiconductor chip 11, a resin package 12 and electrodes 19.

The semiconductor chip 11 is provided with a plurality of electrode pads 14 on its upper surface. The semiconductor chip 11 is mounted on a chip fixing resin 15. Also, the resin package 12 is, for example, formed by transfer molding (or by potting) an epoxy resin so that resin protrusions 17 are integrally formed at predetermined positions on a mounting surface 16 of the resin package 12.

The resin protrusions 17 are protruded downward from the mounting surface 16 of the resin package 12. Also, metal films 13 are provided so as to cover the resin protrusions 17 formed on the resin package 12. The metal films 13 may be configured as a single layer structure or as a multilayer structure. The metal films 13 and the resin protrusions 17 together form the electrodes 19, which serve as external connection terminals. Also, wires 18 are provided between the metal films 13 and the above-described electrode pads 14. Thus, the metal film 13 and the semiconductor chip 11 will be electrically connected.

Referring again to FIG. 1, step 10 of the adhering process will be described. In step 10 (S10), a semiconductor device collective body 31 (see FIG. 15) is manufactured.

The semiconductor device 10 shown in FIG. 2 is formed by, first, manufacturing a plurality of such semiconductor devices 10 simultaneously (multiple forming) and then individualizing the semiconductor devices 10 by a dicing process (described later). In other words, in order to improve productivity, the semiconductor devices 10 are not manufactured individually. The semiconductor device collective body 31 is a structure having the semiconductor devices 10, which are not yet individualized but are in a collective state.

The step 10 is a process for forming the semiconductor device collective body 31.

Figure 9:
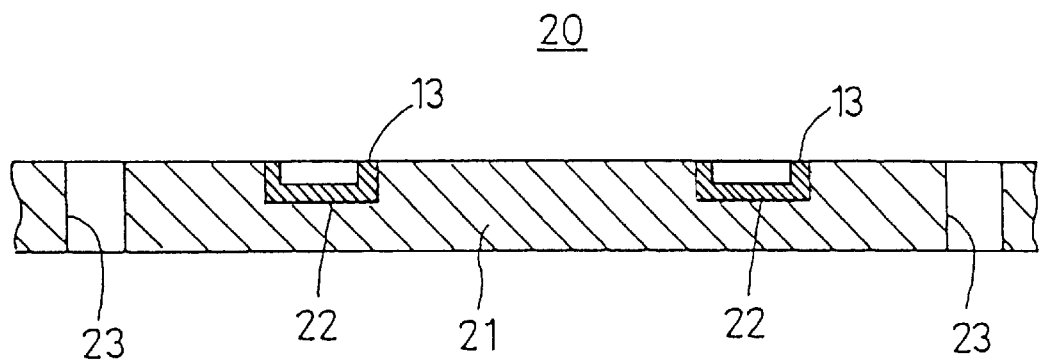
FIG. 9 is a diagram showing a metal film forming process and a plating-resist removing process implemented in the method of manufacturing a lead frame.

The semiconductor device collective body 31 is manufactured using a lead frame 20 shown in FIG. 9. The lead frame 20 includes a conductive metal base material 21 provided with a plurality of recessed parts 22 formed thereon and a plurality of metal films 13 formed in the recessed parts 22. The recessed parts 22 are formed at positions corresponding to the resin protrusions 17 formed on the semiconductor device 10. Also, the metal films 13 are configured so as to fit with the resin protrusions 17.

Also, as will be described later, the lead frame 20 is constructed in such a manner that a plurality of semiconductor devices 10 can be formed simultaneously. Thus, a plurality of sets of the recessed parts 22 and the metal films 13 are also provided on a single metal base material 21. Also, in the present embodiment, regions of neighboring semiconductor devices 10 are very close to each other, in order to achieve a high-density structure.

Referring to FIGS. 3 to 9, a method of manufacturing the lead frame 20 used for forming the semiconductor device collective body 31 will be described.

Figure 3:
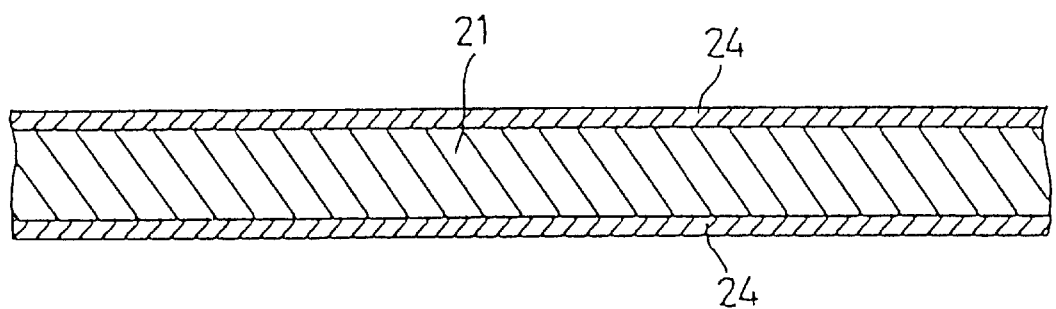
FIG. 3 is a diagram showing an etching-resist applying process implemented in a method of manufacturing a lead frame.

In order to manufacture the lead frame 20, as shown in FIG. 3, the plate-like metal base material 21 made of an electrically conductive material (e.g., copper) is prepared. Then, etching resists 24 are applied on both upper and lower sides of the metal base material 21. The etching resist 24 is for example a photosensitive resin and can be formed as to have a predetermined thickness by applying liquid photosensitive resin after a dry film has been adhered.

Figure 4:
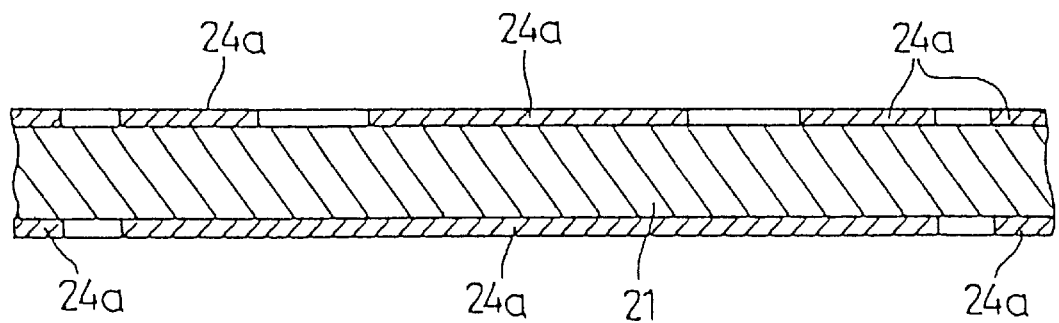
FIG. 4 is a diagram showing an etching-resist pattern forming process implemented in the method of manufacturing a lead frame.

Then, the etching resists 24 are subjected to an exposure treatment using masks, not shown. Subsequently, a developing process is implemented so as to remove parts of the etching resists 24 corresponding to the positions of the recessed parts and to positions of jig holes. Thus, an etching resist pattern 24a shown in FIG. 4 is formed (etching resist pattern forming process).

When the etching resist pattern forming process is completed, an etching treatment is implemented on the metal base material 21 provided with the etching resist pattern 24a (etching process). In the etching process, at the positions corresponding to the recessed parts 22, a half-etching is implemented only from the upper side of the metal base material 21, and two-side etching is implemented at the positions corresponding to the positioning holes 23. Note that when the metal base material 21 is made of copper (Cu), a suitable etchant may be ferric chloride.

Figure 5:
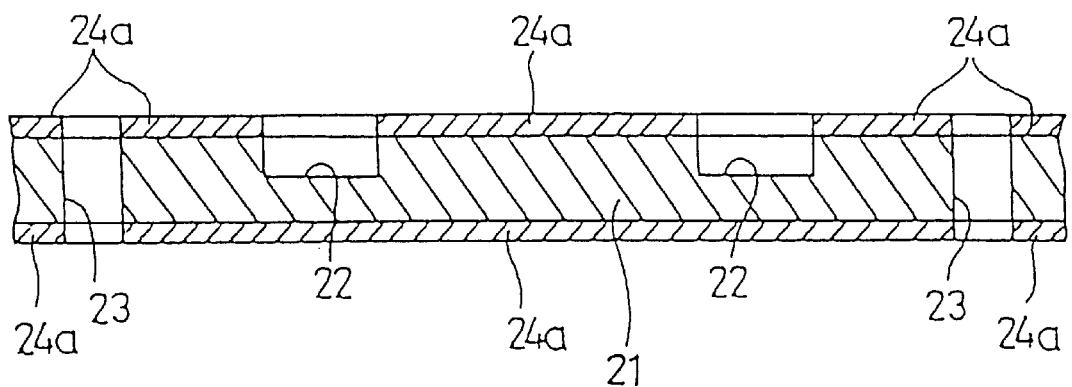
FIG. 5 is a diagram showing an etching process implemented in the method of manufacturing a lead frame.

Thus, as shown in FIG. 5, the metal base material 21 is provided with the recessed parts 22 formed at predetermined recessed-part forming positions and positioning holes 23 formed at predetermined positioning-hole forming positions. The recessed part 22 formed by half-etching may have a depth of approximately 60% of the thickness of the metal base material 21.

Figure 6:
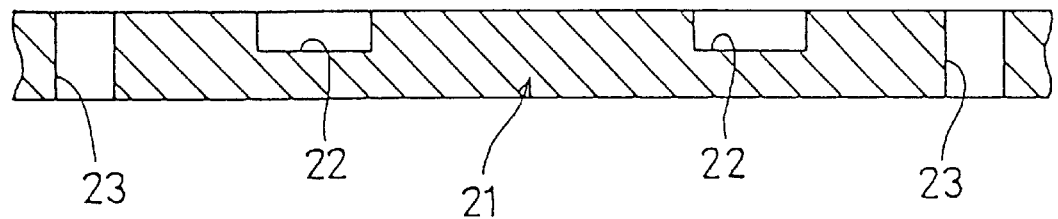
FIG. 6 is a diagram showing an etching-resist removing process implemented in the method of manufacturing a lead frame.

After the etching process, a process for removing the etching resist pattern 24a (etching resist removing process) is implemented. Then, as shown in FIG. 6, the metal base material 21 is obtained which is only has the recessed parts 22 and the positioning holes 23.

Figure 7:
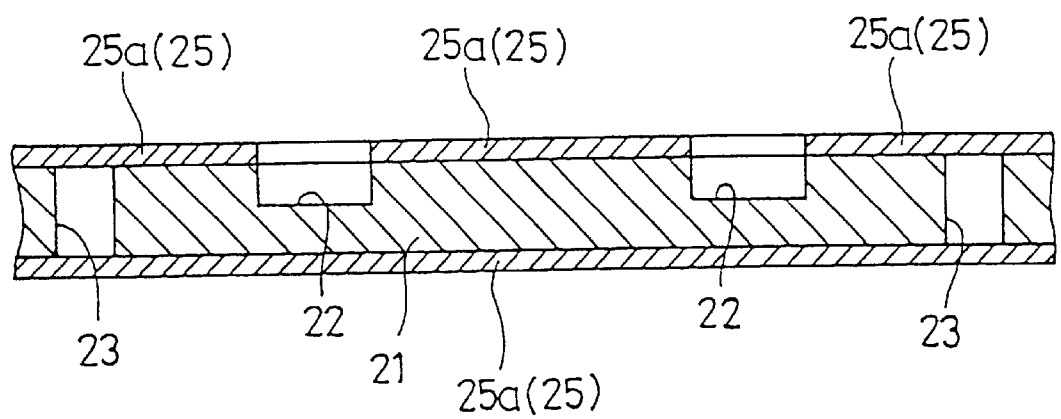
FIG. 7 is a diagram showing a plating-resist applying process and a plating-resist pattern forming process implemented in the method of manufacturing a lead frame.

Subsequently, plating resist 25 is applied on both upper and lower sides of the metal base material 21 shown in FIG. 6 (plating resist applying process). Then, the plating resist 25 is subjected to an exposure process using masks, not shown. Subsequently, a developing process is implemented so as to remove only parts of the plating resist 25 corresponding to the positions of the predetermined recessed part forming positions. Thus, plating resist patterns 25a shown in FIG. 7 are formed (plating resist pattern forming process).

As described above, the plating resist pattern forming process differs from the etching resist pattern forming process shown in FIG. 4. The difference is that the plating resist pattern 25a is exposed only at the positions corresponding to the recessed parts 22 and other parts of the metal base material 21, including the positions corresponding to the positioning holes 23, are entirely covered.

Figure 8:
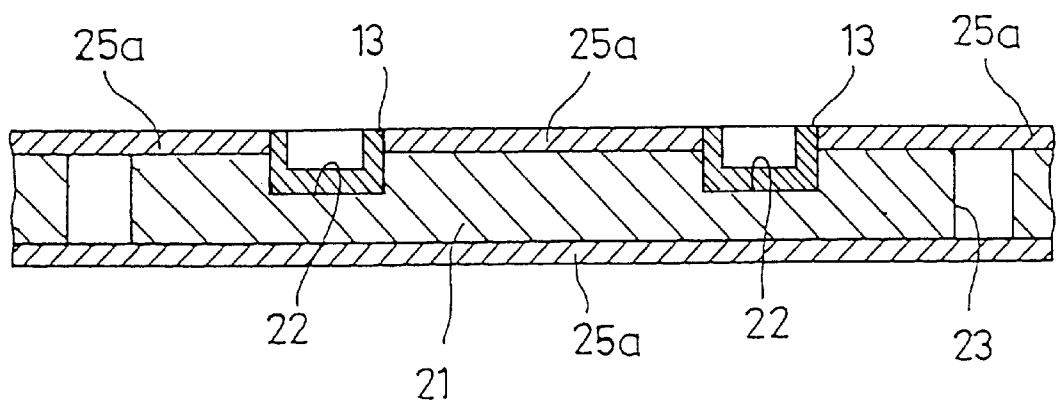
FIG. 8 is a diagram showing a metal film forming process and a plating-resist removing process implemented in the method of manufacturing a lead frame.

When the plating resist pattern forming process is completed, as shown in FIG. 8, metal films 13 are formed (metal film forming process). In the present embodiment, the metal films 13 are formed using a plating technique. Note that the metal films 13 of the present embodiment may be of a triple layered structure in which an outer layer, an intermediate layer and an inner layer are laminated. The outer, intermediate, and inner layers may be made of gold (Au), palladium (Pd) and gold, respectively.

After the metal films are formed in the recessed parts 22 in the metal film forming process, plating resist patterns 25a are removed. Then a surface smoothing process of the metal base material 21 is implemented. Thus, the lead frame shown in FIG. 9 is formed.

Next, a method of manufacturing the semiconductor device 10 using the above-described lead frame 20 will be described.

Figure 10:
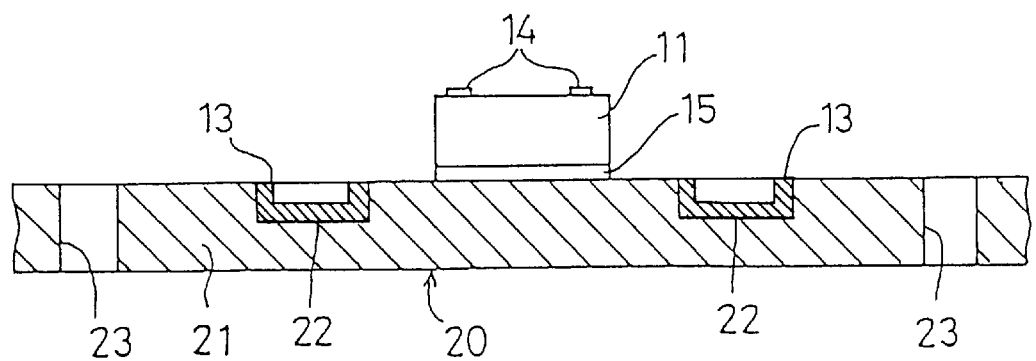
FIG. 10 is a diagram showing a chip-mounting process of one embodiment of a method of manufacturing a semiconductor device according to the present invention.

As shown in FIG. 10, in order to manufacture the semiconductor device 10, the chip fixing resin 15 is applied at a predetermined chip mounting position on the lead frame 20. Then, the semiconductor chip 11 is mounted on the chip fixing resin 15 (chip mounting process). The chip fixing resin 15 is an insulative resin and also serves as an adhesive agent. Therefore, the semiconductor chip 11 will be mounted on the lead frame 20 by an adhesive force exerted by the chip fixing resin 15.

Figure 11:
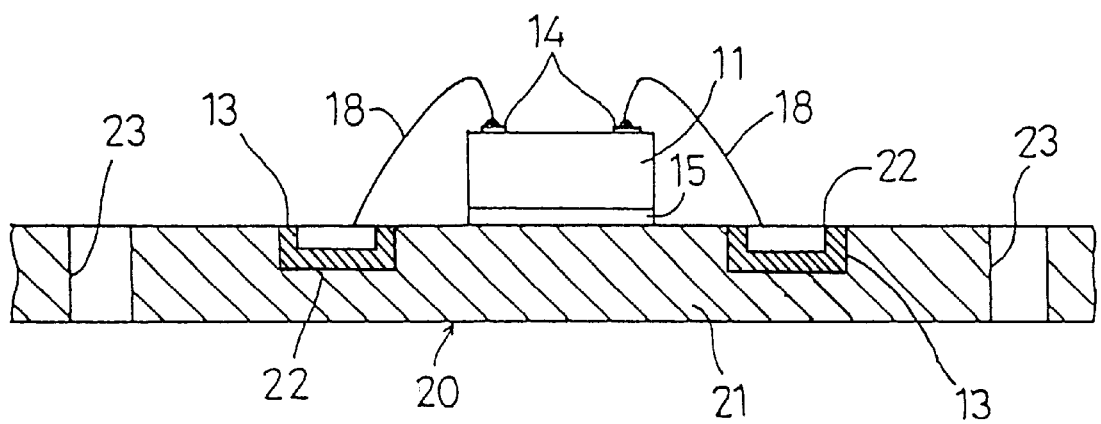
FIG. 11 is a diagram showing a connecting process of one embodiment of a method of manufacturing a semiconductor device according to the present invention.
Figure 12A:
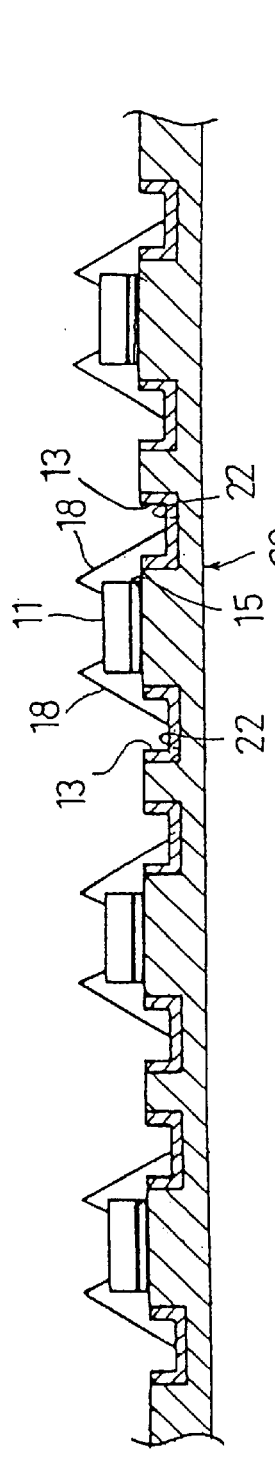
FIG. 12A is a cross-sectional diagram showing a lead frame after the connection process and FIG. 12B is a plan view of the lead frame shown in FIG. 12A.
Figure 12B:
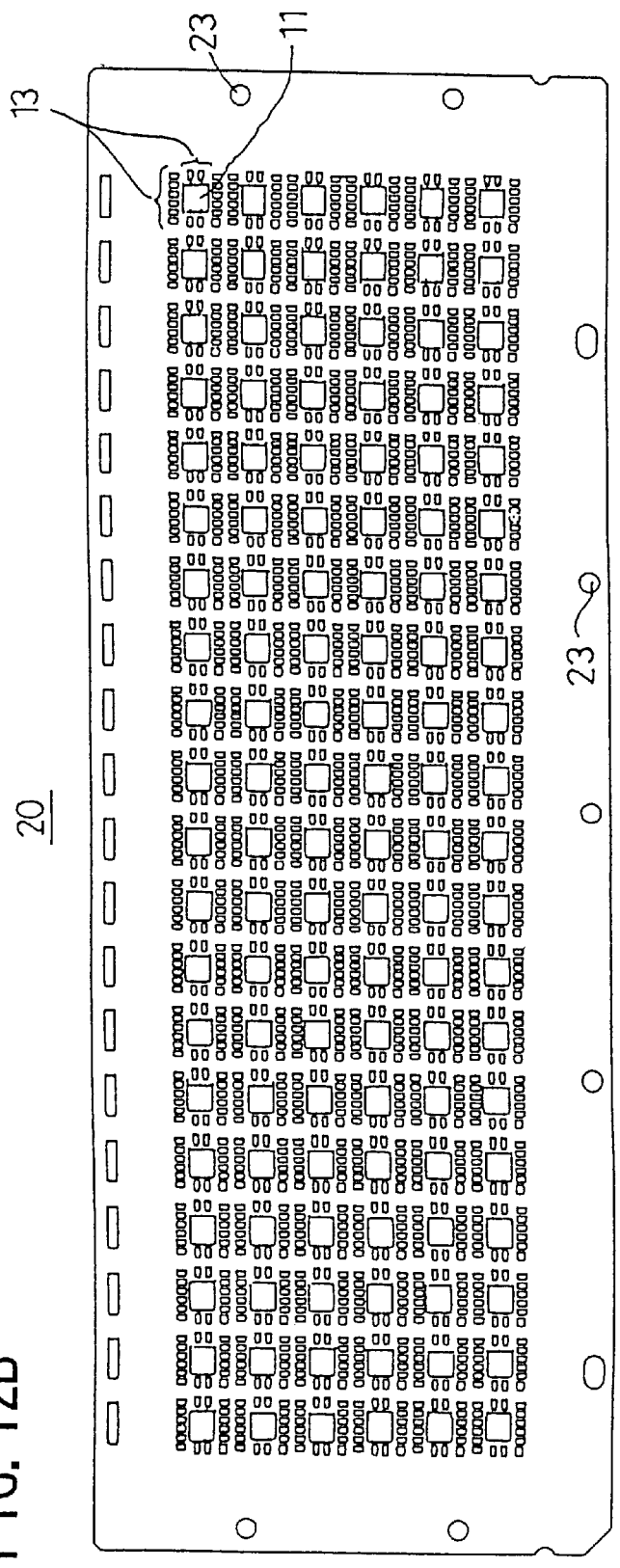

After the chip mounting process, the lead frame 20 is mounted in a wire-bonding machine. As shown in FIG. 11, the wires 18 are provided between the electrode pads 14 formed on the semiconductor chip 11 and the metal films 13 formed on the lead frame. Thus, the semiconductor chip 11 and the metal films 13 are electrically connected (connecting process). FIG. 12A is a cross-sectional diagram showing a lead frame after the connection process and FIG. 12B is a plan view of the lead frame shown in FIG. 12A. Note that the wires 18 are not shown in FIG. 12B.

After the above-described connecting process, a resin 27 is formed for sealing the plurality of semiconductor chips 11 provided on the lead frame 20 (sealing process).

In the present embodiment, the resin 27 is formed by a transfer-molding technique, but other resin forming techniques such as potting are also possible. In order to implement the potting technique, first, a frame is provided on the lead frame 20. The frame serves as a dam portion for blocking the flow of the potting resin. Then, the resin is potted in this frame.

Figure 13A:
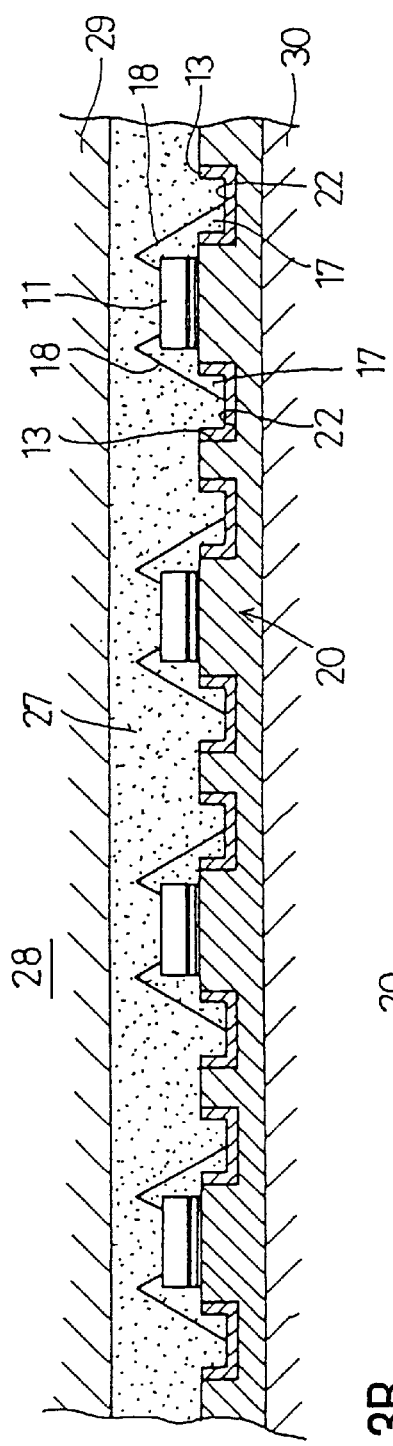
FIGS. 13A and 13B are a cross-sectional diagram and a plan view, respectively, showing a sealing process of one embodiment of a method of manufacturing a semiconductor device according to the present invention.

As shown in FIG. 13A, in the sealing process, the lead frame 20 is mounted on a mold 28 so as to implement transfer molding. The mold 28 used in the present embodiment includes an upper mold 29 and a lower mold 30.

The lower mold 30 is structured as a flat surface provided with cavities because it faces the lead frame 20. The upper mold 29 is structured as a flat surface without any cavities which correspond to individual ones of the resin packages.

Figure 13B:
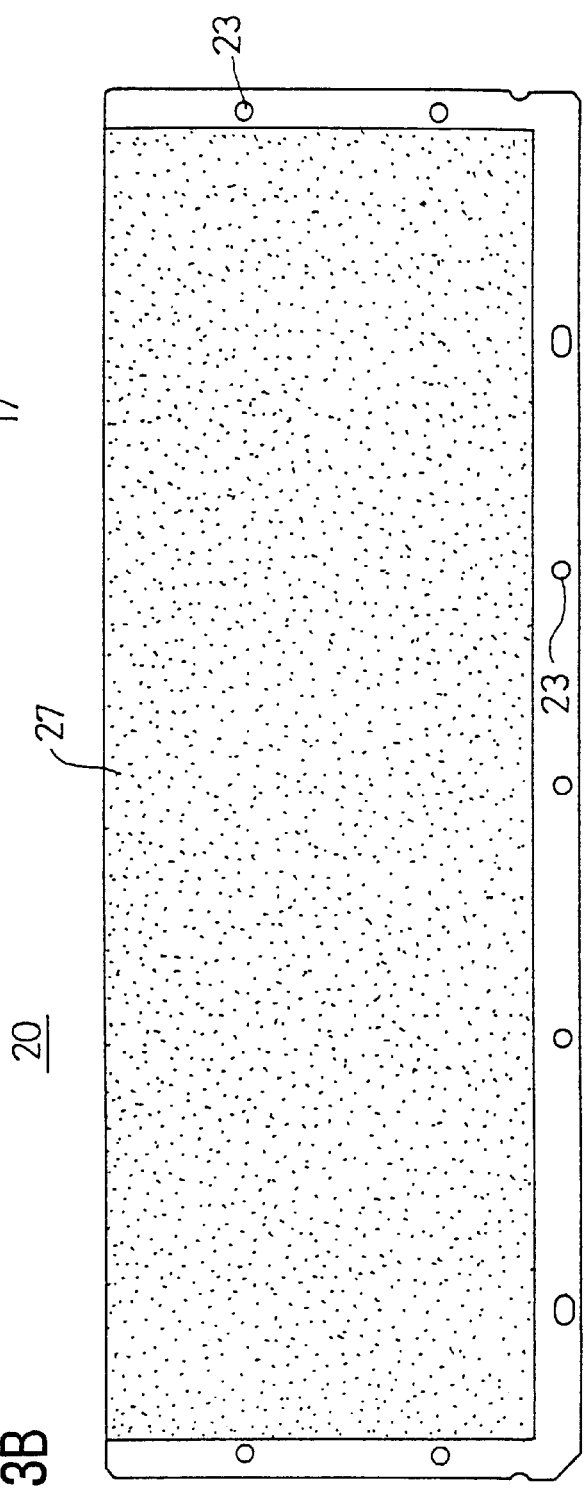

In the present embodiment, since the upper mold 29 does not include any cavities as described above, the plurality of semiconductor chips 11 mounted on the lead frame 20 will be sealed simultaneously by the resin 27 in the sealing process. That is to say, in the sealing process, a plurality of semiconductor chips 11 are sealed in a single step by the single resin 27 rather than forming individual resin packages 12. FIG. 13B is a plan view showing the lead frame 20 in which the resin 27 is formed.

With the sealing process using the mold 28 having the structure as described above, it is no longer necessary to form cavities and gates corresponding to the resin packages. Thus, the structure of the mold 28 can be simplified. Also, since the gates are not required, the semiconductor chips 11 can be positioned close to each other. Thus, it is possible to miniaturize the mold 28 and to further improve an efficiency of multiple forming. Further, a gate removing process can be omitted from the subsequent processes. Thus, the manufacturing processes of the semiconductor devices 10 can be simplified.

Also, when there is a change in the size of the resin package 12, it is not necessary to modify the structure of the mold 28. It is sufficient to alter the dividing positions of the resin 27. Therefore, there is an improved flexibility regarding the change of size of the resin package 12. The dividing process of the resin sealing body 27 will be described later.

Figure 14:
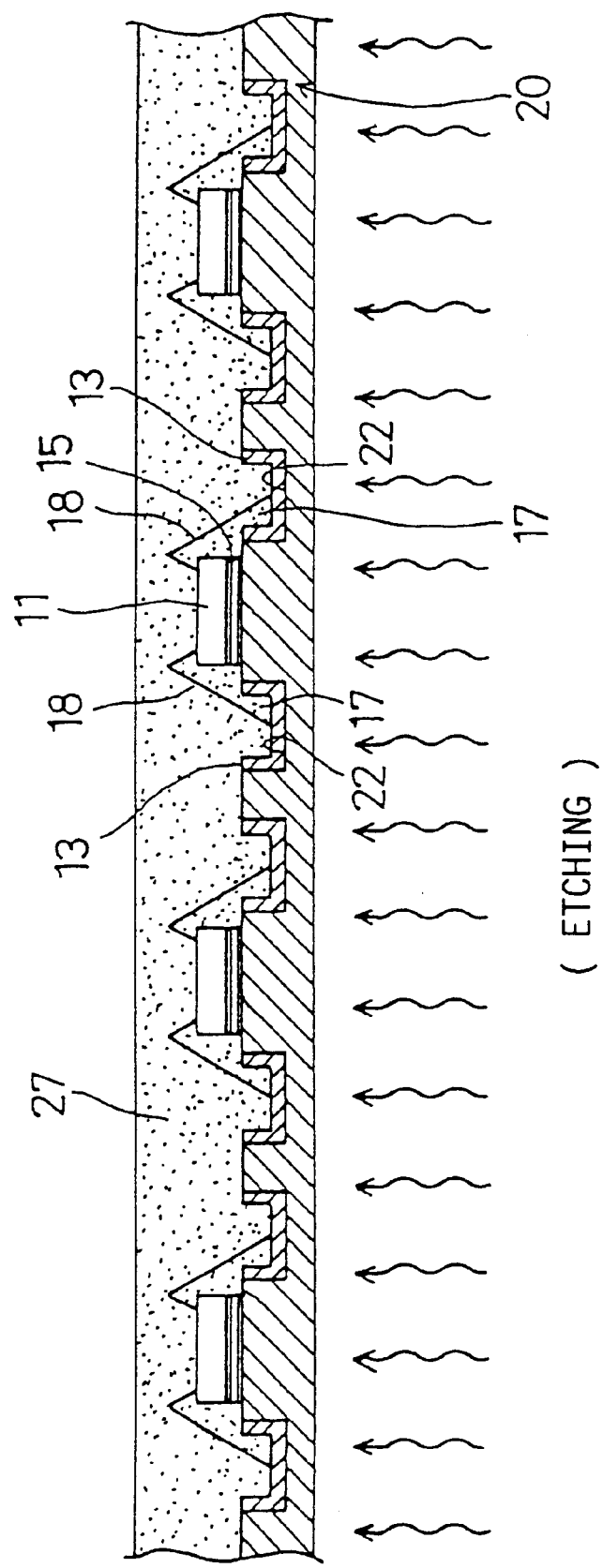
FIG. 14 is a diagram showing a separating process of one embodiment of a method of manufacturing a semiconductor device according to the present invention.

After the above-described sealing process, the resin 27 is separated from the lead frame 20 (separating process). FIG. 14 is a diagram showing the separating process. In FIG. 14, the resin 27 is separated from the lead frame 20 by spraying etchant on the lead frame 20.

The etchant used in the separating process is selected such that it only dissolves the lead frame 20 and not the metal films 13. Therefore, by completely dissolving the lead frame 20, the resin 27 is separated from the lead frame 20. Thus, with such a separating method, the separating process of the resin 27 from the read frame 20 can be positively and easily implemented. Therefore, the yield can be improved.

Figure 15A:
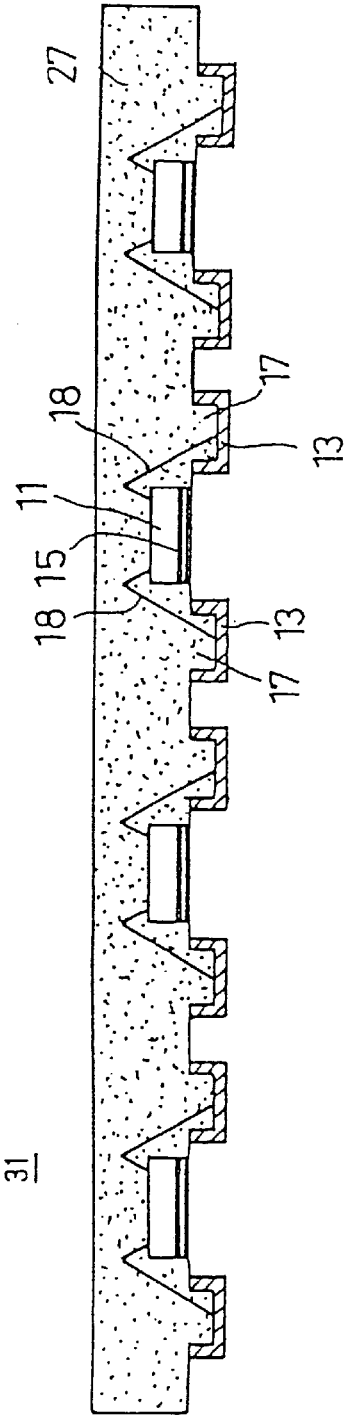
FIGS. 15A and 15B are a cross-sectional diagram and a plan view, respectively, showing a resin-sealed body after the separating process.
Figure 15B:
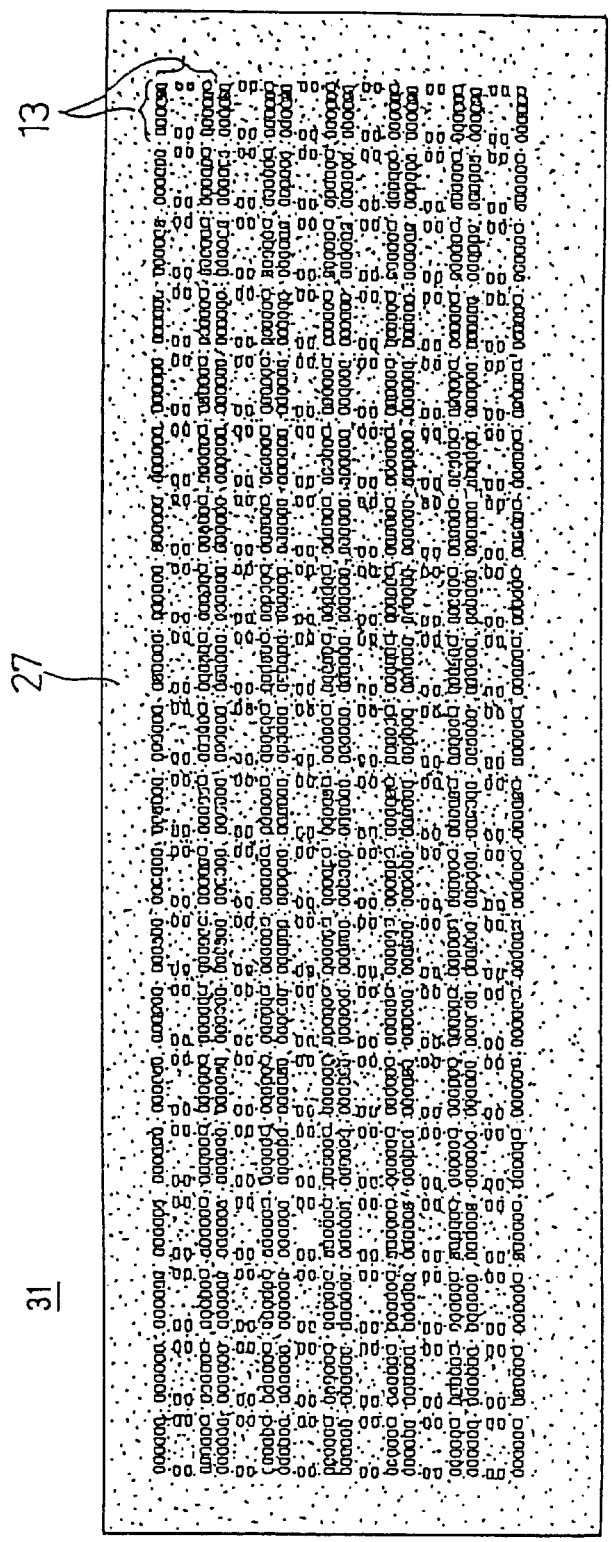

FIGS. 15A and 15B are diagrams showing the semiconductor device collective body 31 formed by implementing each of the processes described above. FIG. 15A is a cross-sectional diagram of the semiconductor device collective body 31 and FIG. 15B is a bottom view of the semiconductor device collective body 31.

As shown in FIGS. 15A and 15B, in the present embodiment, even after the separating process, the resin 27 is not yet divided into individual semiconductor devices 10. Therefore, the plurality of semiconductor chips 11 can be handled simultaneously as a semiconductor device collective body 31. Note that with such a semiconductor device collective body 31, the semiconductor chips 11 and the metal films 13 remain in an accurately aligned state.

Referring again to FIG. 1, after the forming process of the semiconductor device collective body 31 (step 10), the processes including the steps 11 and 12, or the processes including steps 13 and 14, are selectively implemented.

Figure 16:
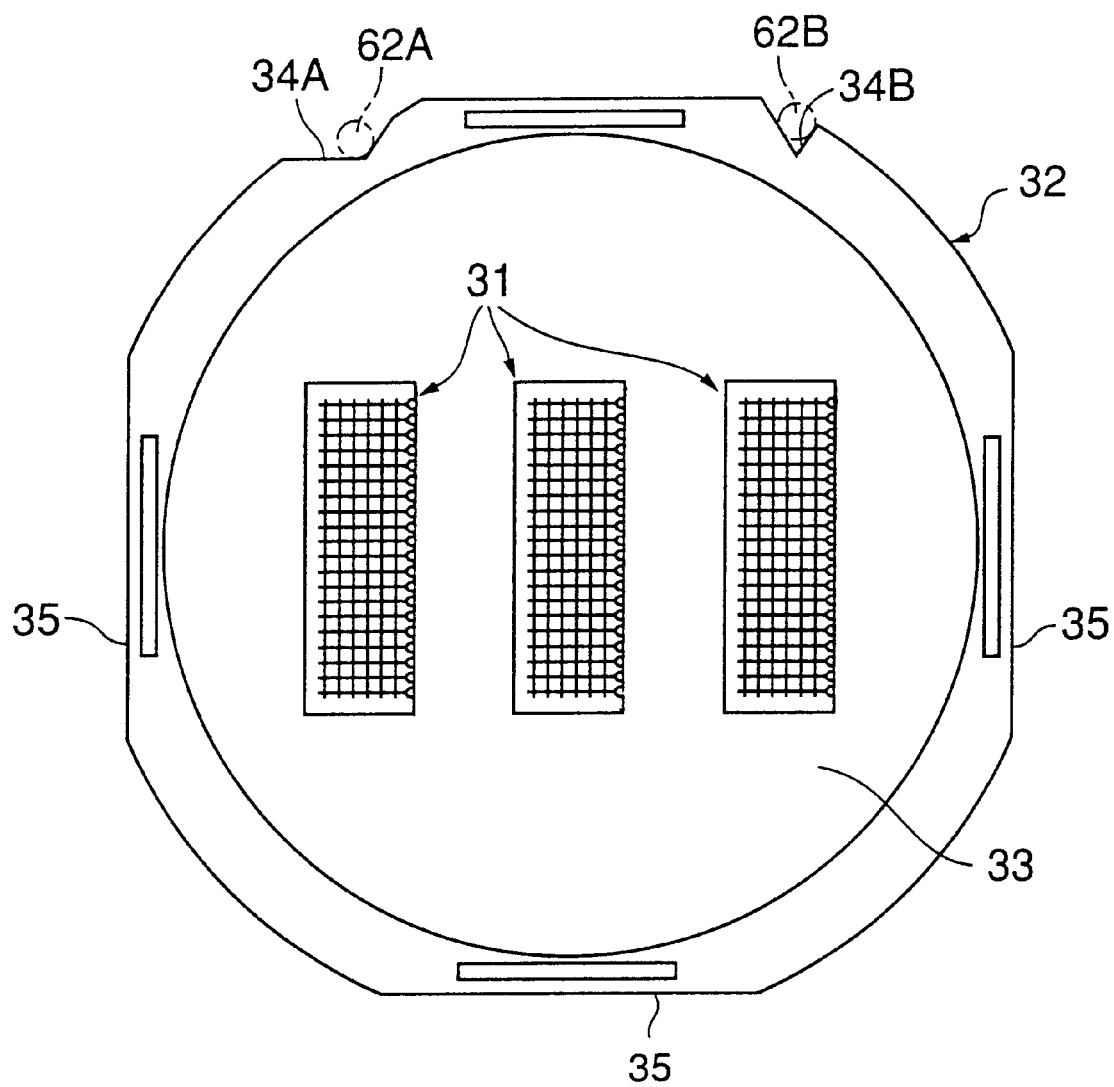
FIG. 16 is a plan-view showing a collective body of semiconductor devices attached to a tape-holding ring (adhesive tape).

In steps 11 and 12, first, the semiconductor device collective body 31 is mounted on a tape-holding ring 32 which serves as a tape-holding member (step 11). FIG. 16 is a diagram showing the semiconductor device collective body 31 mounted on the tape-holding ring 32.

As shown in FIG. 16, the tape-holding ring 32 is provided with an adhesive tape 33 on its lower surface. The tape-holding ring 32 has a structure similar to that of a wafer frame used in a dicing process implemented in the normal manufacturing process of the semiconductor device. It can be said that the tape-holding ring 32 is not a newly manufactured element in the present method of manufacturing the semiconductor device. Accordingly, the tape-holding ring 32 does not give rise to an increased cost for testing the semiconductor device.

The adhesive tape 33 adhered on the tape-holding ring 32 is provided with an adhesive material applied on its surface. Therefore, in order to mount the semiconductor device collective body 31 on the tape-holding ring 32, first, the semiconductor device collective body 31 is adhered on the adhesive tape, and then the adhesive tape 33 is adhered on the tape-holding ring 32.

The semiconductor device collective body 31 is adhered in such a manner that the electrodes 19 formed thereon are positioned at an upper part. Thus, the semiconductor device collective body 31 can be mounted on the tape-holding ring 32 as shown in FIG. 16. FIG. 16 shows an example in which three semiconductor device collective bodies 31 are mounted on the tape-holding ring 32.

Figure 17:
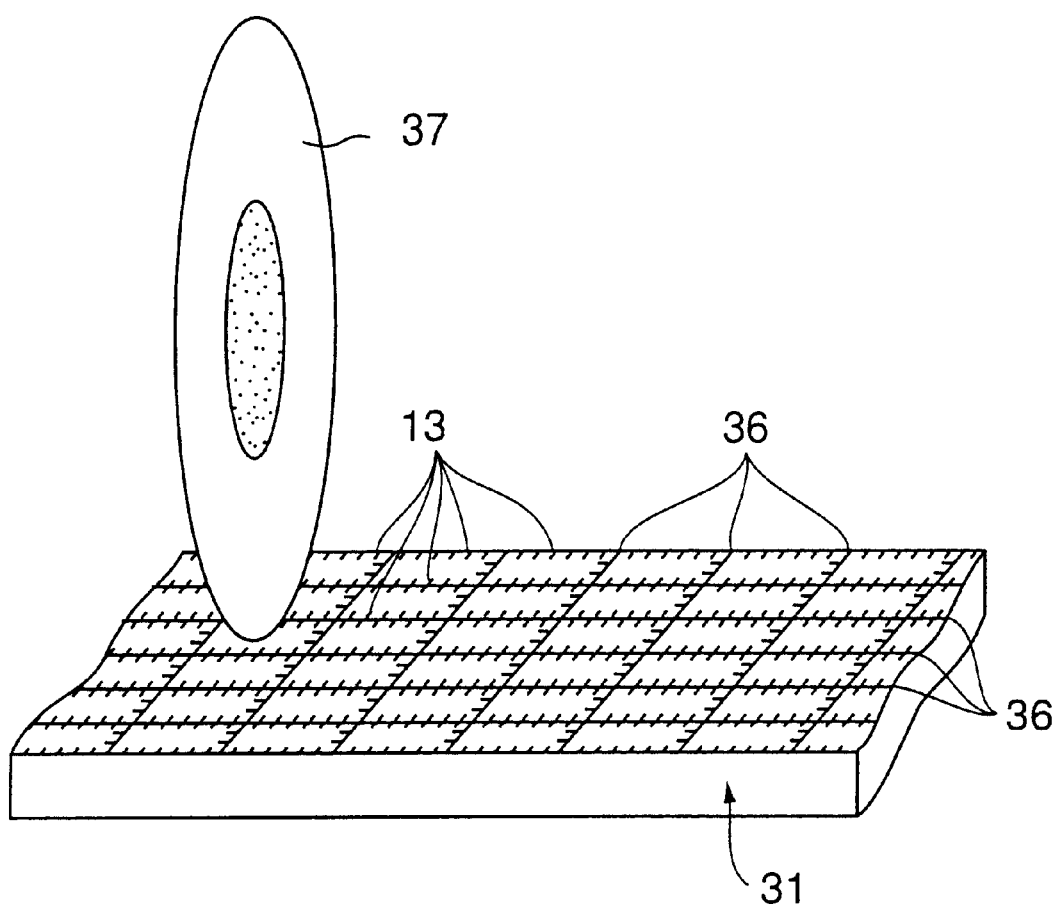
FIG. 17 is a perspective view showing how the collective body of semiconductor devices is diced.

After the semiconductor device collective body 31 has been mounted on the tape-holding ring 32 in step 11, the semiconductor collective body 31 undergoes a dicing process (cutting process) (step 12). As shown in FIG. 17, the dicing process is implemented using a cutting saw 37. The cutting saw 37 cuts along predetermined cut lines 36 which will serve as boundary lines of the individual semiconductor devices 10. Thus, by implementing the dicing process, the semiconductor device collective body 31 is individualized into separate semiconductor devices 10.

As has been described above, the dicing process is implemented on the semiconductor device collective body 31 which is adhered on the adhesive tape 33. Therefore, even after the dicing process, the individualized semiconductor device 10 remains adhered on the adhesive tape 33. That is to say, the plurality of individualized semiconductor devices 10 are adhered on the adhesive tape 33 provided on the tape-holding ring 32.

Figure 18:
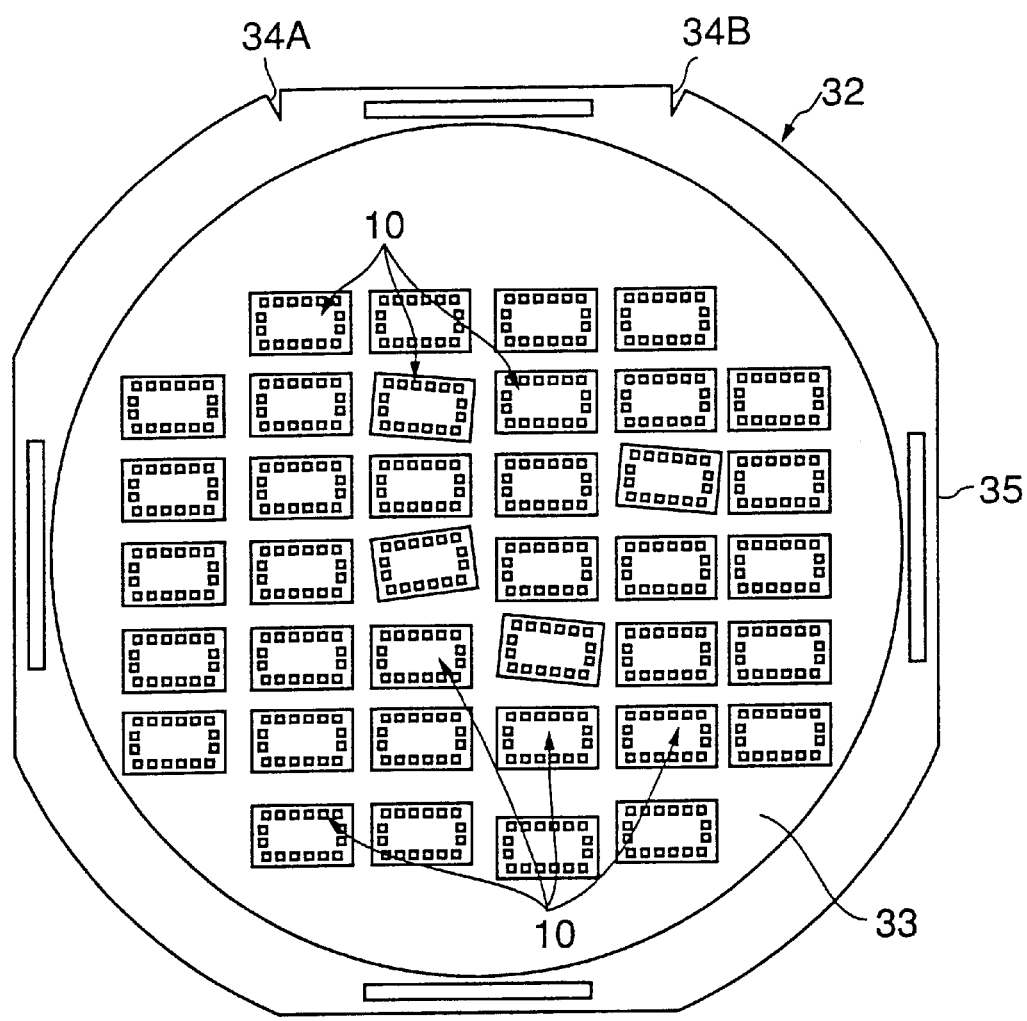
FIG. 18 is a plan-view showing semiconductor devices individualized by dicing.

FIG. 18 is a diagram showing the semiconductor devices 10 after the dicing process. For the sake of convenience, each of the semiconductor devices 10 is enlarged in the Figure.

As has been described above, in the dicing process, the semiconductor collective body 31 is divided by means of the cutting saw 37. Thus, a comparatively large cutting force is exerted while individualizing the semiconductor devices 10. Therefore, even if the semiconductor device collective body 31 is cut along substantially straight cut lines 36, as shown in FIG. 17, the semiconductor device 10 will not be aligned, as shown in FIG. 18. In other words, the positions of the semiconductor devices 10 on the adhesive tape 33 are dispersed. Also, there is no regularity in the dispersion of the positions of the semiconductor devices 10. The dispersion occurs randomly.

It is also possible to implement step 11 only, and not to implement step 12. The semiconductor device collective body 31, in which the plurality of semiconductor devices 10 are integrated, may be subjected to each of the steps starting with step 15. Also, since step 12 is not implemented, the semiconductor devices 10 included in the semiconductor device collective body 31 are maintained in a regular predetermined positions.

On the other hand, in steps 13 and 14, first, the semiconductor device collective body 31 is individualized into semiconductor devices by implementing the dicing process (step 13). In the present embodiment, the semiconductor devices 10 are individualized by the dicing process in step 13, but another method is also possible.

For example, in order to individualize the semiconductor devices 10, grooves can be formed along the cut line 36 by means of the cutting saw 37 and then the resin 27 can be broken in a similar manner to breaking chocolate. In other words, in the individualizing process of the semiconductor devices 10 in step 13, it is not always necessary to adhere the semiconductor device collective body 31 on the adhesive tape 33.

After the semiconductor devices 10 are individualized in step 13, the individualized semiconductor devices 10 are provided on the above-described tape-holding ring 32 in the subsequent step 14. In other words the individualized semiconductor devices 10 are adhered on the adhesive tape 33. Note that the semiconductor devices 10 are adhered such that the electrodes 19 provided thereon are on the upper side. Thus, the individualized plurality of semiconductor devices 10 will be adhered on the adhesive tape 33 provided on the tape-holding ring 32.

Figure 19:
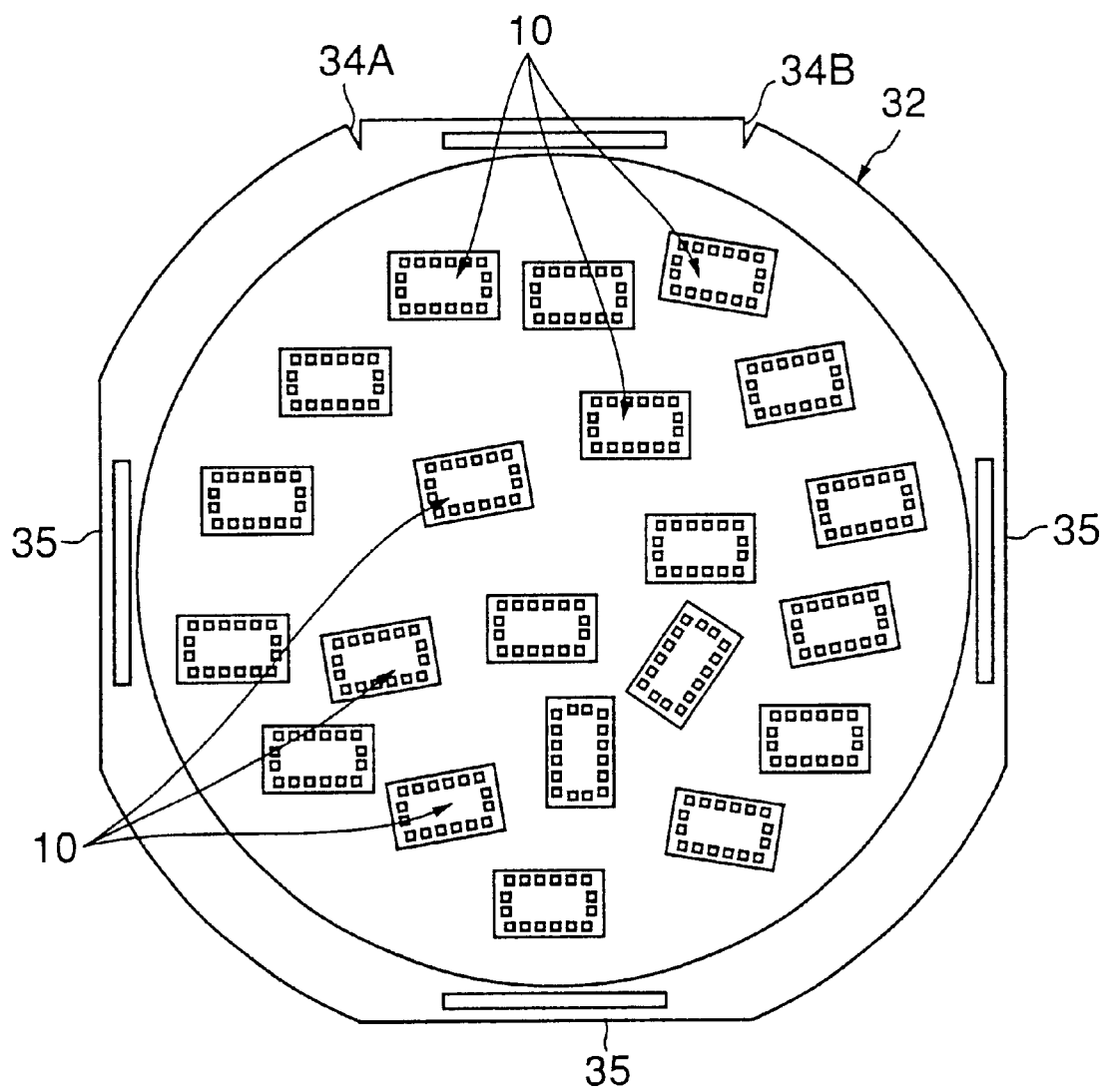
FIG. 19 is a diagram showing semiconductor devices attached to a tape-holding ring (adhesive tape), the semiconductor devices having been individualized by dicing.

FIG. 19 is a diagram showing the semiconductor devices 10 after the steps 13 and 14 have been completed. For the sake of convenience, each of the semiconductor devices 10 is enlarged in the Figure.

When providing the individual semiconductor devices 10 on the tape-holding ring 32, it is possible to align the semiconductor devices 10 with a high accuracy by using a device such as a handler which may be driven with a high accuracy. However, since a high-performance handler is comparatively expensive and also takes up a considerable time for positioning, there is an increase in a testing cost and a reduction in a test efficiency.

Therefore, in the present embodiment, as shown in FIG. 19, in order to achieve a reduction of testing cost and an efficient mounting on the tape-holding ring 32, the semiconductor devices 10 are aligned with a comparatively low accuracy. Thus, when using this method, the semiconductor devices 10 may be positioned on the adhesive tape 33 with an irregular dispersion.

By implementing the above-described adhering process (steps 10 to 14), the plurality of individualized semiconductor devices 10 will be adhered on the adhesive tape 33 provided on the tape-holding ring 32.

After step 10, the method may be selectively proceeded to steps 11, 12, or to steps 13, 14, or to step 11 only. In any of the above three cases, the semiconductor device test, which will be described later, can be implemented.

When steps 11, 12 are selected, first, the semiconductor device collective body 31 is fixed on the adhesive tape 33, mounted on the tape-holding ring 32, and then individualized by cutting the semiconductor device collective body 31. Therefore, it is not necessary to separately adhere the individualized semiconductor devices 10 onto the adhesive tape 33. In order to simplify the testing process, it is advantageous to implement steps 11, 12 or step 11 only. Also, in the adhering process used in the present embodiment, since accommodation containers, such as a tray, required in the related art are no longer necessary, it is possible to reduce the testing cost.

After the above-described adhering process, the position correction process (steps 15 to 19) is implemented.

Figure 20:
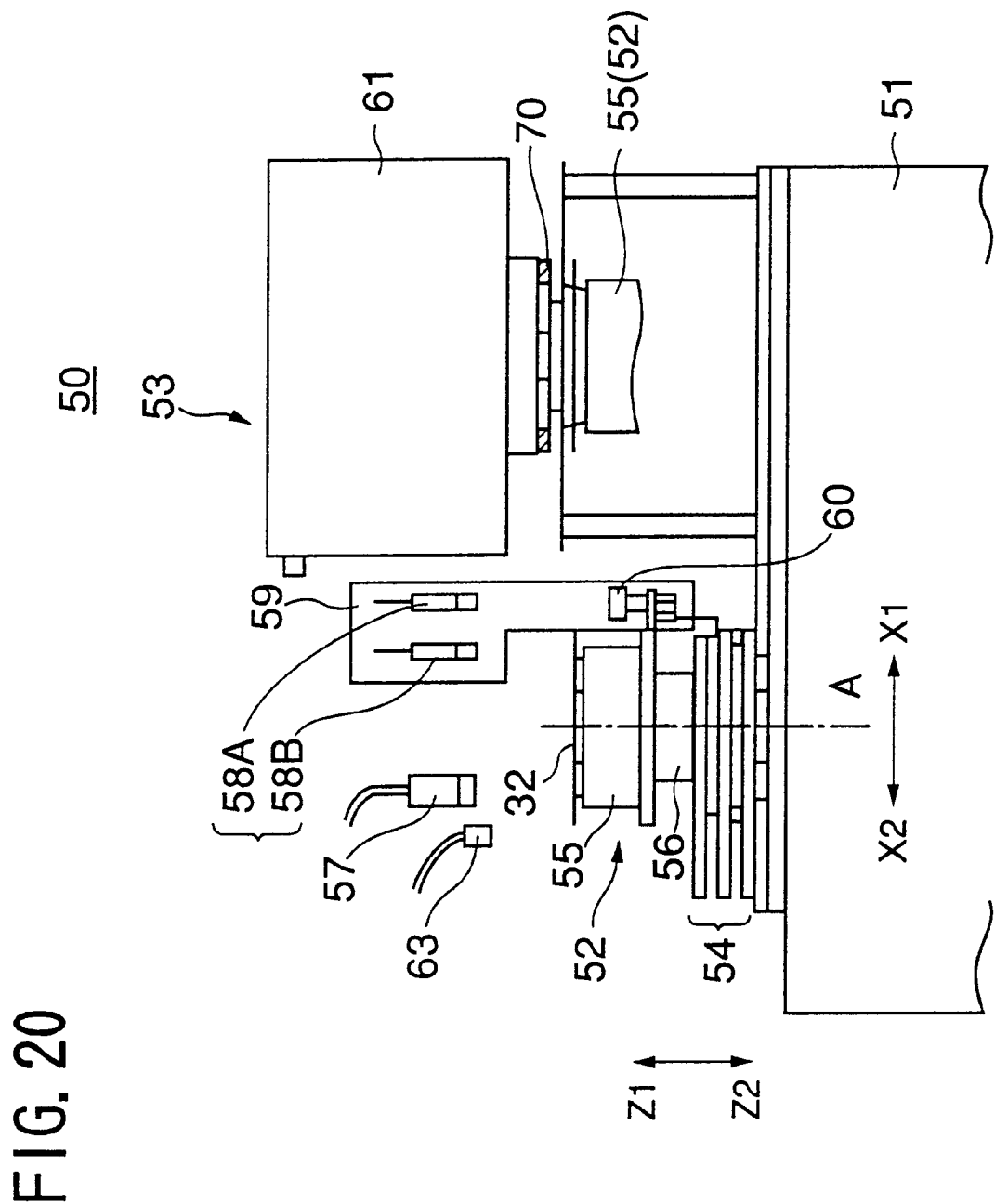
FIG. 20 is an elevation view of an apparatus for testing semiconductor devices of one embodiment of the present invention.
Figure 21:
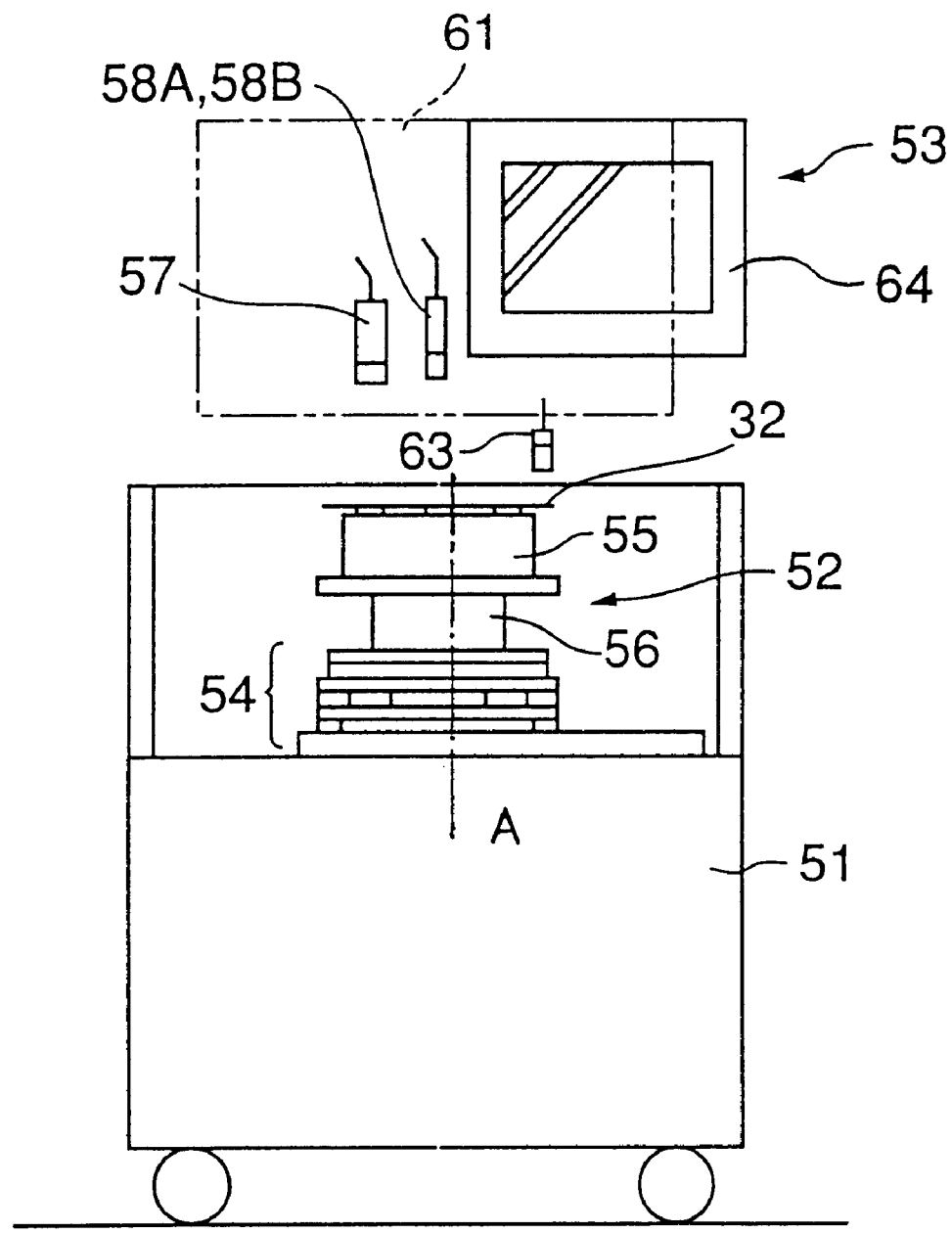
FIG. 21 is a side elevation view of the apparatus shown in FIG. 22.

The position correction process is implemented by means of a testing apparatus 50 shown FIGS. 20 and 21. Before detailed explanation of the position correction process (steps 15 to 19), the structure of the testing apparatus 50 will be described.

Generally, the testing apparatus 50 includes a base 51, a position correction unit 52, an electrical characteristic test unit 53, and various CCD cameras (CCDs) 57, 58A, 58B, 60.

The position correction unit 52 is mainly used in the position correction process. The position correction unit 52 is provided on the base 51 in a movable manner in X1 and X2 directions in the Figure. The position correction unit 52 cooperates with the position recognition CCDs 58A, 58B so as to implement the position recognizing process and the position correcting process using an image processing technique. The position correction unit 52 includes an XYθ table 54, a chuck mechanism 55 and a lifting mechanism 56.

The XYθ table 54 holds with the chuck mechanism 55 provided thereon. The chuck mechanism 55 is used for fixing (chucking) the tape-holding ring 32 mounted thereon, which ring is provided with individualized semiconductor devices 10. Note that in the present embodiment, the tape-holding ring 32 is mounted on the chuck mechanism 55 by hand, but this process can be automated.

The chuck mechanism 55 is provided with positioning pins 62A, 62B corresponding to positioning recesses 34A, 34B formed on the tape-holding ring 32 (see FIG. 16). Thus, by mounting the tape-holding ring 32 on the chuck mechanism 55 and then pressing the recesses 34A, 34B against the positioning pins 62A, 62B, the tape-holding ring 32 will be positioned on the chuck mechanism 55.

Also, by means of a positioning surface 35 formed on the tape-holding ring 32, positioning can be implemented with higher accuracy. Means for fixing (chucking) the tape-holding ring 32 to the chuck mechanism 55 is not limited. Such means may include means for mechanical fixing or means for fixing by means of vacuum.

The XYθ table 54 drives the chuck mechanism 55 to be moved in the X-direction, shown in the Figure, and in a Y-direction (direction into and out of the plane of the paper), and rotated about a central axis (shown by a dash-dot line A). Thus, the tape-holding ring 32 (i.e., the semiconductor devices 10) mounted on the chuck mechanism 55 can be moved in the X-, Y-, and θ-directions.

The lifting mechanism 56 drives the chuck mechanism 55 in Z1- and Z2 directions in the Figure. The lifting mechanism 56 lifts the tape-holding ring 32 in the electrical test process, so as to connect the semiconductor devices 10 to a testing contactor 70 of the electrical characteristic test unit 53.

The position recognizing CCDs 58A, 58B provided on a base member 59 are constructed so as to individually image each of the semiconductor devices 10 provided on the tape-holding ring 32 mounted on the position correction unit 52. In the present embodiment, the position of the semiconductor device 10 having a rectangular shape, respectively, is recognized by identifying the peripheral two sides of the semiconductor device 10. Thus, two position detecting CCDs 58A, 58B are provided in the present embodiment. However, the number of position recognizing CCDs to be provided is not limited to two, but can be of any number suitable for a method of recognizing the position of the semiconductor device 10.

Also, at a position capable of imaging the semiconductor device 10 provided on the tape-holding ring 32 mounted on the position correction unit 52, there is provided a CCD for visual inspection 57 together with the above-described position recognizing CCDs 58A, 58B. The CCD for visual inspection 57 is provided for testing whether there are any damages such as cracks in the periphery of the semiconductor device 10.

Also, a CCD for contactor verification 60 is provided integrally on the side part of the position correction unit 52. Therefore, when the position correction unit 52 moves in the X1-, X2-directions, the CCD for contactor verification 60 also moves in the X1-, X2-directions. Also, the CCD for contactor verification 60 is provided with a lens directed upwards. In the electrical test process described later, when the position correction unit 52 moves to a predetermined position directly under the testing contactor 70, the CCD for contactor verification 60 implements a position recognition of the testing contactor 70.

Further, a bar-code printing unit 63 is provided at the upper part of the position correction unit 52. When a judgement is made as to whether the semiconductor device 10 is a good device or a bad device, in the electrical characteristic test, the bar-code printing unit 63 provides (prints) the obtained data onto the tape-holding ring 32 in the form of a bar-code.

The XYθ table 54, the lifting mechanism 56, various CCDs 57, 58A, 58B, 60, and the bar-code printing unit 63 are connected to a central control unit, not shown, and are controlled and processed simultaneously. The central control unit includes an image processing section for image processing imaging data imaged at each of the CCDs 57, 58A, 58B, 60, a position recognition data storage section for storing position recognition data processed at the image processing section, a judgement data storage section for storing the judgement obtained by the electrical characteristic test unit 53 as to whether or not the semiconductor device 10 is a good device or a bad device, and a visual inspection data storage section for storing visual inspection data obtained by implementing the visual inspection.

The central control unit may be a personal computer. Referring to FIG. 21, the testing apparatus 50 is provided with a monitor 64, on which images imaged at each of the CCDs 57, 58A, 58B, 60 can be displayed. The monitor 64 is also capable of displaying programs and various data, stored in the central control unit, used for testing semiconductor devices.

In the following, the electrical characteristic test unit 53 will be described. The electrical characteristic test unit 53 is mainly used in the electrical test process. The electrical characteristic test unit 53 includes a testing apparatus main body 61 and the testing contactor 70. The testing apparatus main body 61 stores testing programs for implementing the electrical characteristic test on the semiconductor device 10. According to the testing program, testing signals are supplied to each of the semiconductor devices 10 via the testing contactor 70, and a judgment is made as to whether the semiconductor device 10 is a good device or a bad device.

The semiconductor device 10 position corrected by the position correction unit 52 is connected to the testing contactor 70. Thus, the testing contactor 70 and the semiconductor devices 10 will be electrically connected. Also, the testing contactor 70 is connected to the testing apparatus main body 61. Therefore, when the semiconductor devices 10 are connected to the testing contactor 70, the semiconductor chips 11 included in the semiconductors 10, respectively, will be connected to the testing apparatus main body 61. Therefore, it is possible to implement the electrical characteristic test on the semiconductor chips 11 by means of the testing apparatus main body 61.

Figure 22:
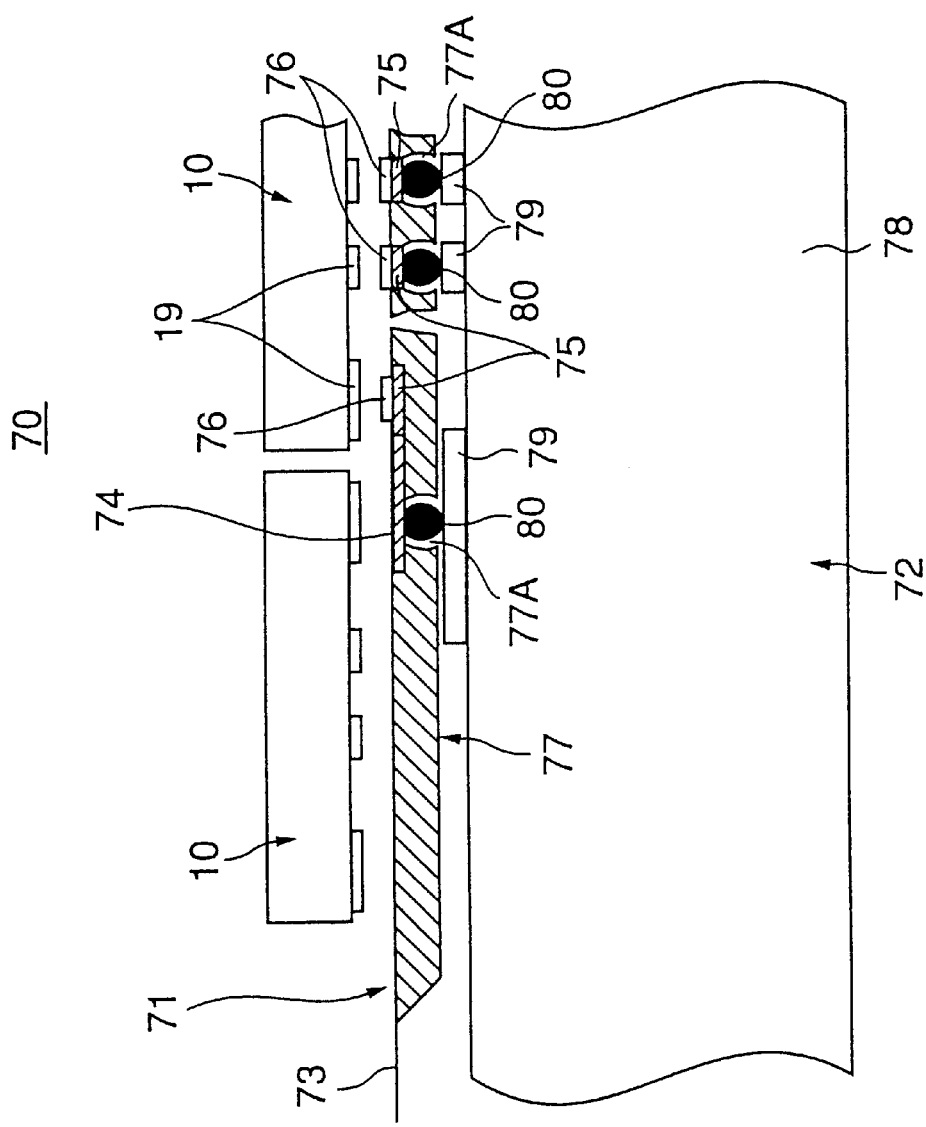
FIG. 22 is an enlarged side view of a contactor used for testing semiconductors.

FIG. 22 is an enlarged diagram showing the testing contactor 70. Note that FIG. 22 shows a state directly before connecting the semiconductor devices 10 to the testing contactor 70.

The testing contactor 70 includes a TAB-tape (flexible substrate), a printed-circuit board 72, an elastic member 77, and solder balls (electrically conductive ball members) 80.

The TAB-tape 71 is a flexible film-like substrate and is constructed by a resin film 72, for example, of polyimide, and film-side interconnections 74 formed on the resin film 73. The resin film 72 is provided with openings formed at positions opposing the electrodes 19 of the semiconductor device 10, so as to form exposed parts at which the film-side interconnections 74 are exposed. The exposed parts are provided with plating films 76 formed thereon, which may be made of, for example, gold (Au). Thus, at positions opposing the electrodes 19, the film-side interconnections 74 are provided with contact parts 75 to be electrically connected with the electrodes 19.

The printed-circuit board 72 is provided on the above-described testing apparatus main body 61. (In FIG. 22, the testing contactor 70 is illustrated in an inverted position compared to that shown in FIG. 20). The printed-circuit board 72 includes a board main body 78, made of a generally used glass-epoxy, on which board-side interconnections 79 are formed. One end of the board-side interconnections 79 is electrically connected to the testing apparatus main body 61, and, as shown in the Figure, the other end is electrically connected to the contactor part 75.

The elastic member 77 is elastic and insulative rubber material provided between the TAB-tape 71 and the printed-circuit board 72. Also, the elastic member 77 is provided with recessed parts 77A at positions opposing the contact parts 75. The solder balls 80 are provided in the recessed parts 77A. The contact parts 75 and the board-side interconnections 79 are electrically connected by means of the solder balls 80.

According to the above-described structure, when the semiconductor devices 10 are connected to the testing contactor 70, the electrodes 19 of the semiconductor devices 10 are connected to the board-side interconnections 79 formed on the printed-circuit board 72 via the contact parts 75 and the solder balls 80. Therefore, the distance between the electrodes 19 of the semiconductor device 10 and the board-side interconnections 79 of the printed-circuit board can be reduced compared to a structure of the related art using probe pins. Thus, it is possible to achieve a reduction of impedance between the electrodes 19 and the board-side interconnections 79 and to implement a high-frequency test on the semiconductor devices 10.

Also, the contact parts 75 can be formed at a higher density (narrower pitch) compared to the probe pins of the related art, since the contact parts 75 are formed on the resin film 73. Accordingly, it is possible to handle high-density semiconductor devices 10, even if the pitch between the electrodes 19 are narrowed due to a high-density structure of the semiconductor devices 10.

The elastic member 77 for elastically supporting the resin film 73 is provided between the TAB-tape 71 and the printed-circuit board 72. Therefore, any variations of the height of the electrodes 19 of the semiconductor devices 10 and the height of the solder balls 80 will be cancelled out by an elastic deformation of the elastic member 77. Further, when the semiconductor device 10 is connected to the testing contactor 70, since the elastic member 77 provides an elastic force between the contact parts 75 and the electrodes 19, it is possible to improve an electrical connectivity of the semiconductor devices 10 and the testing contactor 70.

Now, the position correcting process and the electrical test process will be described, which processes are implemented by means of the testing apparatus 50 of the above-described structure.

In the position correcting process, first, in step 15, a mounting process for mounting the tape-holding ring 32 onto the chuck mechanism 55 of the position correction unit 52 is implemented. In the mounting process, positioning can be implemented by engaging the positioning recesses 34A, 34B formed on the tape-holding ring 32 with the positioning pins 62A, 62B provided on the chuck mechanism 55. Therefore, the tape-holding ring 32 can be mounted on the chuck mechanism 55 (positioning correction unit 52) easily and with a comparatively high accuracy.

When the tape-holding ring 32 is mounted on the position correction unit 52, the position recognizing CCDs 58A, 58B image one of the plurality of semiconductor devices 10 fixed on the adhesive tape 33, so as to recognize the position of the relevant semiconductor device 10. The position recognizing process is implemented by the central control unit performing image processing based on the image data imaged at the position recognizing CCDs 58A, 58B. The position recognition data thus produced is stored in the position recognition data storage section of the central control unit.

After the position recognizing process (step 16), the semiconductor device 10 is subjected to a visual inspection which is implemented using the CCD for visual inspection 57. The visual inspection is implemented by the central control unit which performs image processing based on the image data imaged at the CCD for visual inspection 57.

In detail, data of the semiconductor devices in a normal state (normal visual data) is pre-stored in the central control unit. A judgement as to whether each semiconductor device is a good device or a bad device is made by comparing the normal visual data and the image data imaged by the CCD for visual inspection 57. Visual inspection data thus produced is stored in the visual inspection data storage section.

Also, when only step 11 is implemented in the adhering process, that is to say, when the position correcting process is implemented for the semiconductor device collective body 31, the above-described step 17 will not be implemented since the semiconductor devices 10 are not yet individualized.

Thus, in the present embodiment, when implementing position recognition for the individual semiconductor devices 10 in the position correcting process, the visual inspection is also implemented. Therefore, since the semiconductor devices 10 are subjected to the visual inspection, in addition to the electrical characteristic test, it is possible to improve the reliability of the semiconductor test. Also, since the visual inspection is simultaneously implemented in the position correcting process, there will be no increase in the number of testing processes. Therefore, it is possible to improve a testing efficiency.

The above-described processes of steps 16 and 17 are implemented on all of the semiconductor devices 10 mounted on the tape-holding ring 32 (step 18). In the present embodiment, the CCDs for position recognizing 58A, 58B and the CCD for visual inspection 57 are provided separately, but it is also possible to combine the CCD for visual inspection 57 into the CCDs for position recognizing 58A, 58B.

After the position recognizing data and the visual inspection data of all of the semiconductor devices 10 mounted on the tape-holding ring 32 are input to the central control unit, the position correcting process is implemented on the semiconductor devices 10 (step 19).

In step 19, first, the position correction unit 52 is moved in the X1-direction shown in FIG. 20. As has been described above, the position correction unit 52 is provided with the CCD for contactor verification 60 which moves with the position correction unit 52. When the position correction unit 52 is moved to the predetermined position under the electric characteristic test unit 53, the CCD for contactor verification 60 detects the testing contactor 70 and the central control unit stops the movement of the position correction unit 52.

Then, based on the position recognition data of each of the semiconductor devices 10 stored in the position recognition data storage section during the processes of steps 15 to 18, the position correction unit 52 implements the position correcting process for matching the positions of the semiconductor device 10 to be subjected to the electrical characteristic test and the testing contactor 70 (step 19).

In detail, the central control unit implements position recognizing of the testing contactor 70 using the image data from the CCD for contactor verification 60. Also, the position recognition data of the semiconductor device 10 to be tested is stored in the position recognizing data storage section. Based on each data, an amount of movement (X-, Y-direction movement, θ-direction rotation) of the semiconductor device 10 to be tested required for matching the positions of the electrodes 19 provided on the semiconductor device 10 to be tested and the positions of the contact parts 75 of the testing contactor 70 is calculated. Based on the obtained required amount of movement, the central control unit drives the XYθ table 54 of the position correction unit 52. Thus, the position correction process of the semiconductor device 10 to be tested against the testing contactor 70 is implemented.

In the position correcting process of the present embodiment, the semiconductor devices 10 adhered on the adhesive tape 33 are subjected to position recognition and position correction using the information processing technique. Therefore, even with the semiconductor devices 10 fixed on the adhesive tape 33 at different positions, it is possible to implement position recognition and position correction on semiconductor devices 10, individually.

By using the image processing technique, the position recognition and position correction can be implemented with a comparatively high accuracy. Also, with the image processing technique, the change in the size of the semiconductor device 10 can easily be dealt with by modifying the configuration data (data to be stored in the image processing device) related to the semiconductor device 10. Therefore, the semiconductor devices can be tested without modifying the mechanical arrangement (e.g., the tape-holding ring 32 and the chuck mechanism 55) for various semiconductor devices 10 of different sizes.

After the position correcting process, the electrical test process of steps 20 to 22 is implemented.

In step 20, the lifting mechanism 56 is driven so as to lift the tape-holding ring 32 towards the testing contactor 70. During this step, the testing contactor 70 and the semiconductor device 10 to be tested remain in a positioned state by implementing the above-described correcting process.

As a result of the process of step 19, each of the electrodes 19 formed on the semiconductor device 10 to be tested and the contact parts 75 of the testing contactor 70 are in a positioned state. Therefore, each of the electrodes 19 formed on the semiconductor device 10 to be tested will be connected to the contact parts 75 of the testing contactor 70 (step 20) by simply lifting the tape-holding ring 32 by means of the lifting mechanism 56. Thus, each of the electrodes 19 and the contact parts 75 will be electrically connected.

In step 20, the semiconductor device 10 to be tested and the contact parts 75 of the testing contactor 70 are in an electrically connected state. The electrical characteristic test unit 53 is activated and implements a predetermined electrical characteristic test on the semiconductor device 10 to be tested (step 21). In detail, the electrical characteristic test unit 53 supplies testing signals to the semiconductor chip 11 included in the semiconductor device 10 to be tested. Then, based on the output signal obtained, the electrical characteristic test unit 53 judges whether the semiconductor device 10 to be tested is a good device or a bad device.

The judgement data of the semiconductor device 10 to be tested thus obtained is sent to the central control unit. At the central control unit, the judgement data is stored in the judgement data storage section. The above-described processes of steps 19 to 21 are implemented on all semiconductor devices 10 (semiconductor devices 10 to be tested) provided on the tape-holding ring 32 (step 22).

In the present embodiment, the electrical test process is implemented on the semiconductor device 10 position corrected with a comparatively high accuracy in the position correcting process. Thus, even with the high-density semiconductor device 10, the semiconductor device 10 can be accurately and positively connected to the testing contactor 70. Therefore, it is possible to improve the reliability of the electrical characteristic test. Also, the electrical characteristic test can be implemented with each of the semiconductor devices 10 being provided on the tape-holding ring 32. Accordingly, it is possible to improve the testing efficiency compared to the structure of the related art in which the test is implemented by mounting individual semiconductor devices on the electrical characteristic test unit.

After the electrical test process, the carry-out process of steps 23 to 25 is implemented.

In step 23, the good semiconductor devices 10 and the bad semiconductor devices 10 are categorized based on the visual inspection data obtained from the visual inspection process of step 17 and on the judgement data obtained in steps 20 to 22. Then, the semiconductor devices 10 are removed from the tape-holding ring 32 and accommodated in the carrying jig or disposal jig depending on the category (step 23). Then, in step 25, only the good semiconductor devices 10 are carried out from the testing device. Note that when only step 11 is implemented in the above-described adhering process, since the semiconductor devices 10 are in the shape of the semiconductor device collective body 31 before being cut, step 23 cannot be implemented.

Figure 23:
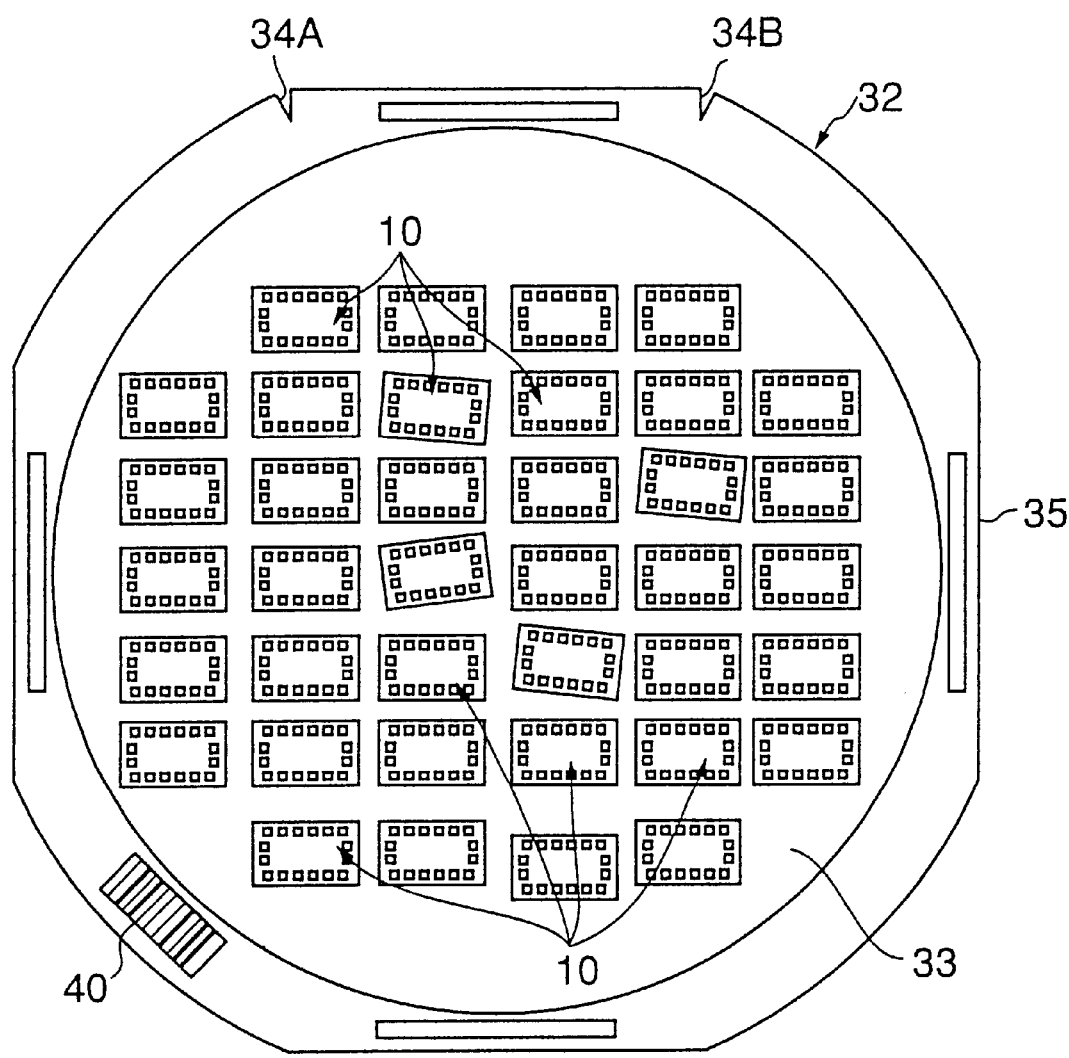
FIG. 23 is a plan view of a tape-holding ring provided with a bar code.

In step 24, a judgement data applying process is implemented in which the visual inspection data obtained by implementing the visual inspection process of step 17 and the judgement data obtained in steps 20 to 22 (in the following, the visual inspection data and the judgement data are generally referred to as the judgment data) is applied to the tape-holding ring 32. In the present embodiment, the judgement data is indicated on the top surface of the tape-holding ring 32 as a bar code 40. FIG. 23 is a diagram showing the tape-holding ring 32 on which the bar code 40 is printed.

If step 24 is implemented, the categorizing process of good devices and bad devices is not implemented in step 25. The semiconductor devices 10 remain fixed on the tape-holding ring 32 in the same positions as when adhered in the adhering process, and then the semiconductor devices 10 or the semiconductor device collective body 31 are carried out together with the tape-holding ring 32. That is to say, the carry-out process is implemented with the good semiconductor devices 10 and the bad semiconductor devices 10 both being provided on the tape-holding ring 32.

Thus, there is no need to categorize the semiconductor devices 10 for the carry-out process, and to re-mount the semiconductor devices 10 on a separate accommodation container (e.g., tray, embossed tape). Therefore, the carry-out process can be simplified.

Also, after the carry-out process, when mounting the semiconductor devices 10 into electronic appliances, only the good semiconductor devices 10 are removed from the tape-holding ring 32 based on the judgement data provided in the bar code 40 indicated on the tape-holding ring 32. (When only step 11 is implemented, the semiconductor devices 10 are removed after dicing). Therefore, the bad semiconductors will not be mistakenly mounted into electronic appliances. Also, the mounting process will not become complicated.

Note that the judgment data need not be indicated in the form of the bar code 40, but can take other forms. Also, the judgement data does not have to be indicated on the tape-holding ring 32 but can be stored in another medium (such as a floppy disk) and the tape-holding ring 32 can be carried out with the medium being attached thereto.

Further, when individual ones of the semiconductor devices 10 are provided with a region for recording the judgement data, the judgement data can be directly provided on the semiconductor devices 10. In such a case, the relevant semiconductor device 10 can be judged as to whether it is a good device or a bad device by directly viewing the judgement data provided on the semiconductor device 10.

Further, the present invention is not limited to these embodiments, but variations and modifications may be made without departing from the scope of the present invention.

The present application is based on Japanese priority application No. 10-341936 filed on Dec. 1, 1998, the entire contents of which are hereby incorporated by reference.

What is claimed is:

1. A method of testing semiconductor devices comprising the steps of:
  a) adhering either a packaged semiconductor device collective body constructed by a plurality of packaged semiconductor devices integrated together or a plurality of individual packaged semiconductor devices onto an adhesive tape provided on a tape-holding member, in a case of said packaged semiconductor device collective body, first, said semiconductor device collective body is adhered on the adhesive tape and then diced into individual packaged semiconductor devices, and in case of said plurality of individual packaged semiconductor devices, first, said packaged semiconductor device collective body is diced into individualized packaged semiconductor devices, and then, said individual packaged semiconductor devices are adhered onto the adhesive tape,
  b) correcting postions of the packaged semiconductor devices by mounting the tape-holding member on a position correction unit and, using an image processing technique, impementing position recognition and position correction of the packaged adhesive tape adhesive tape; and
  c) implementing an electrical characteristic test on the packaged semiconductor devices positioned in step b) by connecting the packaged semiconductor devices to a testing conductor.

2. The semiconductor device testing method as claimed in claim 1, wherein, in said step b), visual inspection is also implemented, on individual semiconductor devices while implementing position recognition on said individual semiconductor devices.

3. The semiconductor device testing method as claimed in claim 1, further comprising, after said step c), a step of:

d) applying judgement data of said semiconductor devices based on results of the test to at least one of said semiconductor device or said tape-holding member.

4. The semiconductor device testing method as claimed in claim 3, further comprising, a step of:

e) carrying out only the semiconductor devices which have been judged as, or can be recognized as, good devices based on said judgement data provided in said step d).

5. The semiconductor device testing method as claimed in claim 4, wherein in said step e), said semiconductor devices are carried out with said tape-holding member in such a manner that said judgement data is indicated on said tape-holding member and said semiconductor devices remain in a state as when adhered on the adhesive tape in said step a).

6. An apparatus for testing a plurality of individualized semiconductor devices adhered on an adhesive tape provided on a tape-holding member, said apparatus comprising:

a position correction unit for implementing position recognition and position correction on each one of said plurality of semiconductor devices using an image processing technique; and an electrical characteristic testing unit for implementing an electrical characteristic test on said semiconductor devices, said electrical characteristic testing unit being provided with a testing contactor to be connected to electrodes formed on said semiconductor devices and said semiconductor devices having been positioned corrected in said position correction unit being connected.

7. The apparatus as claimed in claim 6, wherein said position correction unit is provided with imaging units for implementing visual inspections on each one of said semiconductor devices adhered on said adhesive tape.

8. The apparatus as claimed in claim 6, wherein said testing contactor comprises:

a flexible substrate including a resin film and first interconnections formed on said resin film, said first interconnections being provided with contact parts connected to the electrodes of said semiconductor devices;

a printed wiring board provided with second interconnections formed thereon, said second interconnections being connected to said first interconnections;

an elastic member provided between said flexible substrate and said printed wiring board and elastically supporting said resin film; and conductive ball members provided within said elastic member and electrically connecting said first interconnections and said second interconnections.

* * * * *